United States Patent
Kajiyama et al.

(10) Patent No.: US 8,284,378 B2
(45) Date of Patent: Oct. 9, 2012

(54) ILLUMINATION OPTICAL SYSTEM AND EXPOSURE APPARATUS

(75) Inventors: Kazuhiko Kajiyama, Utsunomiya (JP); Toshihiko Tsuji, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 484 days.

(21) Appl. No.: 12/552,941

(22) Filed: Sep. 2, 2009

(65) Prior Publication Data
US 2010/0053584 A1  Mar. 4, 2010

(30) Foreign Application Priority Data
Sep. 3, 2008 (JP) ................. 2008-225694

(51) Int. Cl.
G03B 27/54 (2006.01)
(52) U.S. Cl. .......................................... 355/67
(58) Field of Classification Search .............. 355/67, 355/71
See application file for complete search history.

(56) References Cited

U.S. PATENT DOCUMENTS

| | | | | |
|---|---|---|---|---|
| 5,459,547 A | * | 10/1995 | Shiozawa | 355/67 |
| 6,868,223 B2 | * | 3/2005 | Shinoda | 385/146 |
| 6,919,951 B2 | * | 7/2005 | Tsuji | 355/67 |
| 7,538,856 B2 | * | 5/2009 | Kajiyama et al. | 355/67 |
| 7,714,987 B2 | * | 5/2010 | Kajiyama et al. | 355/67 |
| 2005/0105290 A1 | | 5/2005 | Tsuji | |
| 2008/0088814 A1 | | 4/2008 | Kajiyama et al. | |

FOREIGN PATENT DOCUMENTS

JP  2005-141158  6/2005
JP  2008-098527  4/2008

* cited by examiner

*Primary Examiner* — Toan Ton
*Assistant Examiner* — Michelle Iacoletti
(74) *Attorney, Agent, or Firm* — Carter, DeLuca, Farrell & Schmidt LLP

(57) ABSTRACT

An illumination optical system includes first and second reflection integrators. The second reflection integrator forms a plurality of linear light sources using light from the first reflection integrator. The illumination optical system further includes a pair of flat plane mirrors that are arranged parallel to the meridional line direction on the second reflection integrator and opposite to each other so as to sandwich the plurality of linear light sources in between, a unit for changing an aperture shape of an aperture stop arranged at an exit side of the second reflection integrator in a direction perpendicular to the meridional line direction so that the aperture stop has an optical Fourier transformation relationship with the surface to be illuminated, and an adjustment unit configured to adjust an interval between the pair of flat plane mirrors as the aperture shape of the aperture stop is changed.

8 Claims, 24 Drawing Sheets

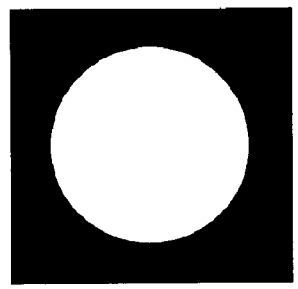
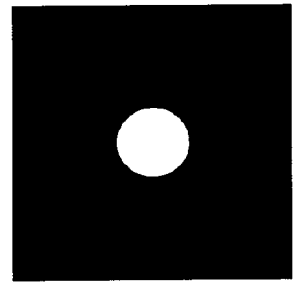
FIG. 17A    FIG. 17B
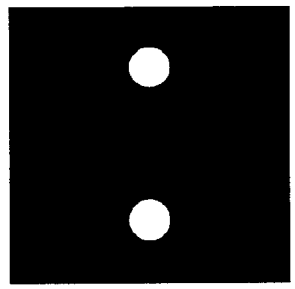
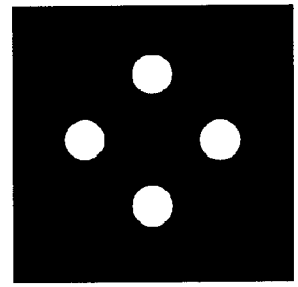
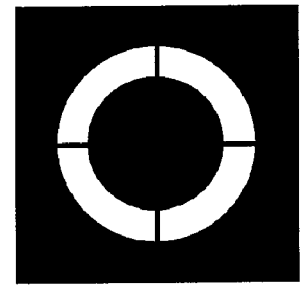
FIG. 17C    FIG. 17D    FIG. 17E

ILLUMINATION OPTICAL SYSTEM AND EXPOSURE APPARATUS

BACKGROUND OF THE INVENTION

1. Field of the Invention

The present invention relates to an illumination optical system and an exposure apparatus.

2. Description of the Related Art

As an exposure apparatus that uses a light source having a smaller wavelength for the improved resolution, there is proposed an (EUV) exposure apparatus that uses the extreme ultraviolet (EUV) light having a wavelength between 10 and 15 nm. Japanese Patent Laid-Open No. ("JP") 2005-141158 (corresponding to U.S. Patent Application Publication No. ("US") 2005/0105290) proposes an illumination optical system for the EUV exposure apparatus, which arranges an aperture stop having a semicircular aperture on a reflection integrator having a plurality of cylindrical reflection surfaces that have parallel meridional line directions.

Other prior art include JP 2008-098527.

In order for the projection optical system to realize high-quality imaging in the exposure apparatus, it is necessary to reduce the distortion of the effective light source of the illumination optical system viewed from each position on a surface to be illuminated. The illumination optical system disclosed in JP 2005-141158 sufficiently maintains the distortion of the effective light source smaller than prior art of those days. However, according to the research by this inventor, it is found that the non-negligible distortion still remains in the effective light source in the illumination optical system of JP 2005-141158, because the aperture stop shields part of the parallel light before the light forms a secondary light source. In addition, the illumination optical systems disclosed in JPs. 2005-141158 and 2008-098527 deteriorate the light use efficiency because it realizes a strong modified illumination, such as a dipole illumination, through light-shielding by the stop.

SUMMARY OF THE INVENTION

The present invention provides an illumination optical system and exposure apparatus, which can provide at least one of an improvement of the light use efficiency and the excellent illumination by restraining the deformation of the effective light source of the illumination optical system.

An illumination optical system according to one aspect of the present invention configured to illuminate a surface to be illuminated includes a first reflection integrator configured to form a plurality of light sources by using light from a light source, a second reflection integrator having a plurality of cylindrical reflection surfaces that possess parallel meridional line directions, the second reflection integrator being configured to form a plurality of linear light sources by using light from the first reflection integrator, a pair of flat plane mirrors that are arranged parallel to the meridional line direction on the second reflection integrator and opposite to each other so as to sandwich the plurality of linear light sources in between, a unit for changing an aperture shape of an aperture stop arranged at an exit side of the second reflection integrator in a direction perpendicular to the meridional line direction so that the aperture stop has an optical Fourier transformation relationship with the surface to be illuminated, and an adjustment unit configured to adjust an interval between the pair of flat plane mirrors as the aperture shape of the aperture stop is changed.

An illumination optical system according to another aspect of the present invention configured to illuminate a surface to be illuminated includes a plurality of first reflection integrators configured to form a plurality of light sources by using light from a light source, the plurality of first reflection integrators having different divergent angles, a first selector configured to arrange one of the plurality of first reflection integrators on an optical path, a second reflection integrator having a plurality of cylindrical reflection surfaces that possess parallel meridional line directions, the second reflection integrator being configured to form a plurality of linear light sources by using light from the first reflection integrator, a pair of flat plane mirrors that are arranged parallel to the meridional line direction on the second reflection integrator and opposite to each other so as to sandwich the plurality of linear light sources in between, a plurality of aperture stops arranged at an exit side of the second reflection integrator in a direction perpendicular to the meridional line direction so that each aperture stop can have an optical Fourier transformation relationship with the surface to be illuminated, and the plurality of aperture stops having different aperture patterns, a second selector configured to arrange one of the plurality of aperture stops on the optical path, and an adjustment unit configured to adjust an interval between the pair of flat plane mirrors, wherein at least one of a selection by the first selector and an adjustment by the adjustment unit is performed in accordance with a selection by the second selector.

Further features of the present invention will become apparent from the following description of exemplary embodiments with reference to the attached drawings.

BRIEF DESCRIPTION OF THE DRAWINGS

FIGS. 17A-17E are plane views of several types of aperture stops that can be changed and applicable to the aperture stop shown in FIG. 1.

DESCRIPTION OF THE EMBODIMENTS

Figure 1:
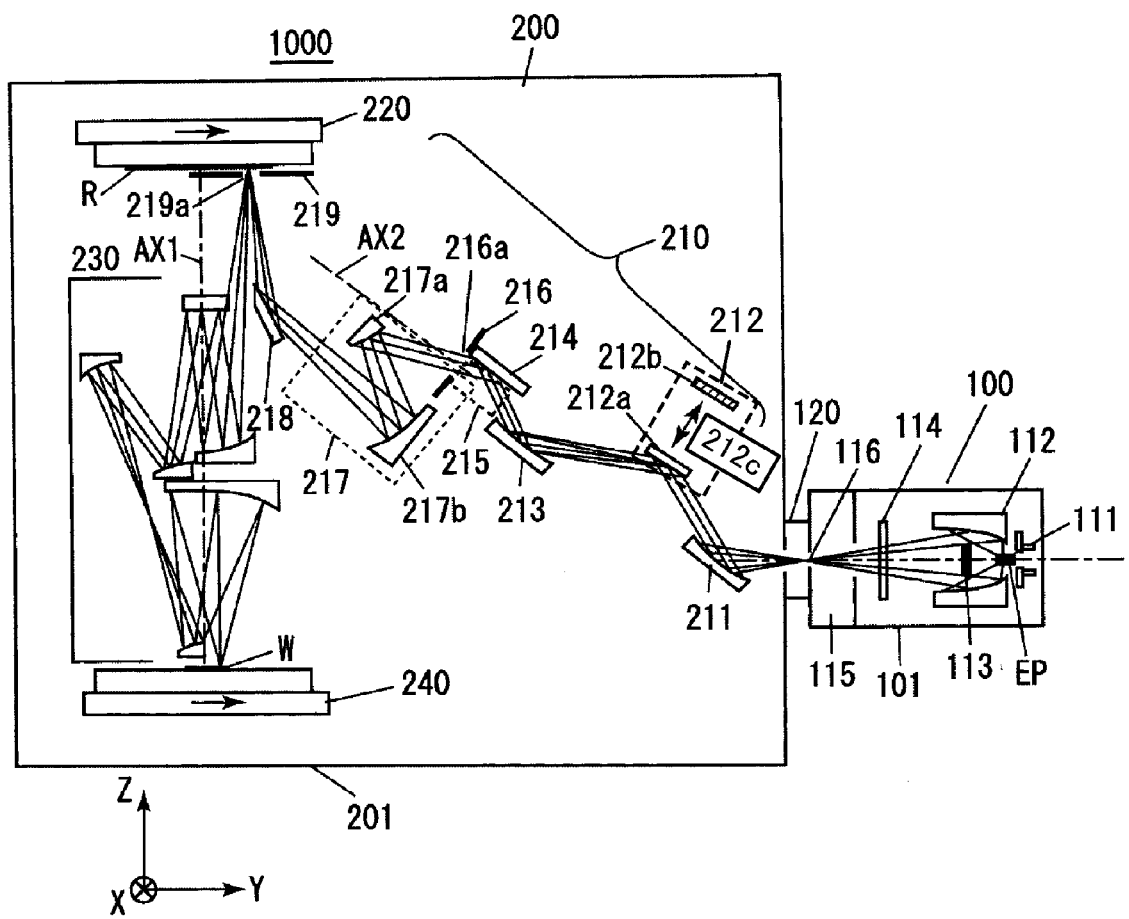
FIG. 1 is a schematic sectional view showing a structure of an exposure apparatus according to this embodiment.

Referring now to FIG. 1, a description will be given of an exposure apparatus 1000 according to a first embodiment. FIG. 1 is a schematic sectional view of the exposure apparatus 1000. The exposure apparatus 1000 is an EUV exposure apparatus configured to expose a circuit pattern of a mask (original) R onto a wafer (substrate) W by using the EUV light (having a wavelength, for example, of 13.5 nm) for the exposure light in a step-and-scan manner.

The exposure apparatus 1000 includes a light source unit 100 and an apparatus body 200. Each component in the light source unit 100 is housed in a vacuum chamber 101, and each component in the apparatus body 200 is housed in a vacuum chamber 201. The vacuum chambers 101 and 201 are connected by a connector 120. During exposure, the insides of the vacuum chambers 101 and 201 are maintained vacuum so as to prevent attenuations of the EUV light.

The light source unit 100 includes a discharge header 111, a condenser mirror 112, a debris filter 113, a wavelength filter 114, a differential pumping mechanism 115, and an aperture 116 in the vacuum chamber 101.

The condenser mirror 112 includes a rotational elliptical mirror etc. configured to collect the EUV light that is approximately isotropically radiated from a plasma emission part EP. The debris filter 113 reduces an infiltration of debris (flying particle), which occurs with a generation of the EUV light, into optical path. The wavelength filter 114 removes the light having a wavelength other than the EUV light generated by the emission part EP. The differential pumping mechanism 115 decreases an internal pressure from the vacuum chamber 101 toward the vacuum chamber 201 step by step. The aperture 116 has a pinhole-shaped opening arranged near the condensing point of the condenser mirror 112. The EUV light as the exposure light passes through the aperture 116 and advances to the apparatus body 200 side.

While this embodiment uses a discharge induced plasma light source for a light source unit 100, another type of EUV light source may be used, such as a laser induced plasma light source.

The apparatus body includes an illumination optical system 210, a mask stage 220, a projection optical system 230, and a wafer stage 240 in the vacuum chamber 201.

The illumination optical system 210 is an optical system configured to propagate the EUV light and to illuminate the mask R. The illumination optical system 210 includes a first optical unit 211, a first reflection integrator 212, a second optical unit 213, a second reflection integrator 214, an auxiliary mirror 215, an aperture stop 216, a third optical unit 217, a plane mirror 218, and a slit 219. The illumination optical system 210 arranges these components along the optical path.

Since all components in the illumination optical system 210 are used in the total reflection areas (except for the third optical unit 217 that needs to reduce a blur amount that would otherwise occur in condensing the light), the illumination optical system 210 can improve the reflectance of the mirror, and efficiently illuminate the mask R.

The first optical unit 211 serves as a collimator optical system.

Figure 2:
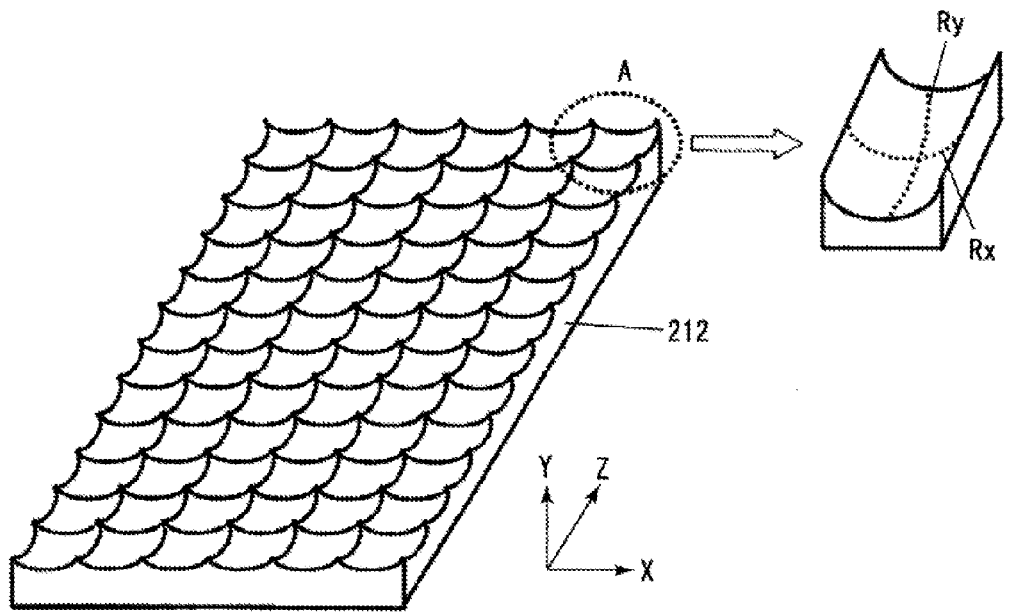
FIG. 2 is a perspective view of a first reflection integrator shown in FIG. 1 and a partially enlarged perspective view of it.

The first reflection (or catoptric) integrator 212 includes one or more (or "a pair of" in this embodiment) integrators 212a and 212b that are exchangeable in accordance with an illumination condition. As described later with reference to FIG. 19, the pair of integrators 212a and 212b have different divergent angles and are exchanged by an exchange unit 212c. The exchange unit 212c serves as a first selector configured to arrange one of the plurality of integrators on the optical path, and as a change unit configured to change a divergent angle of the first reflection integrator 212. Reference numeral "212" of the reflection integrator 212 generalizes 212a, etc. Moreover, as described later, the second reflection integrator 214 and the auxiliary mirror 215 are adjusted so that the illumination efficiency can improve with the exchange. The first reflection integrator 212 uniformly illuminates the second reflection integrator 214, and forms a plurality of point light sources that serve as a secondary light source by using the light from the first optical unit 211. Since the first reflection integrator 212 is used for the total reflection area, the first reflection integrator 212 is formed by a plurality of toroidal surfaces in which an X-axis curvature Rx differs from a Y-axis curvature Ry, as shown in FIG. 2. Here, FIG. 2 is a perspective view of the first reflection integrator 212 and the partially enlarged perspective view of an A part shown by a dotted line. In the first optical unit 211, each area partitioned shown in FIG. 2 will sometimes be referred to as a "device."

The second optical unit 213 is a deflection member configured to deflect the light from the first reflection integrator 212 towards the second reflection integrator 214. In addition, the second optical unit 213 serves to condense the divergent light from the first reflection integrator 212.

Figure 3A:
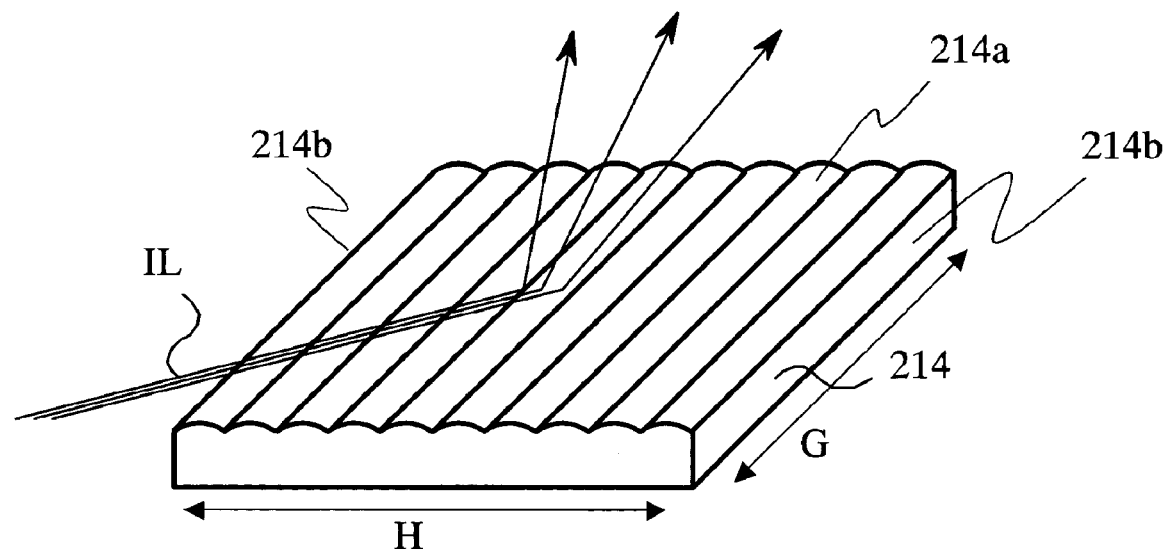
FIGS. 3A and 3B are perspective views of reflection integrators applicable to a second reflection integrator shown in FIG. 1.
Figure 3B:
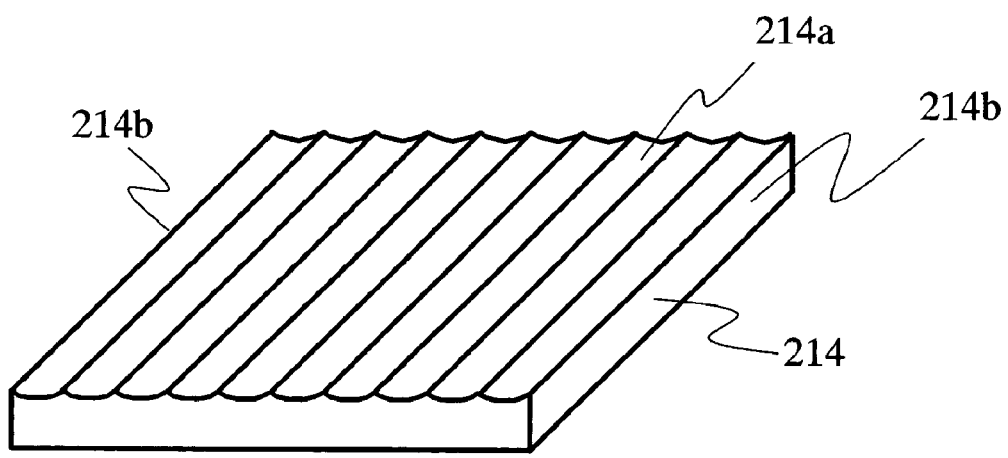

Since the second reflection integrator 214 uniformly illuminates the mask R, the light from the second optical unit 213 forms a plurality of linear light sources. The plurality of linear light sources serve as tertiary light sources. The second reflection integrator 214 may use one of the reflection integrators shown in FIGS. 3A and 3B. The second reflection integrator 214 has a plurality of cylindrical reflection surfaces 214*a* having parallel meridional directions G. FIG. 3A shows that each cylindrical reflection surface has a convex shape and FIG. 3B shows that each cylindrical reflection surface has a concave shape. Reference numeral H in FIG. 3A is an arrangement direction of the plurality of cylindrical reflection surfaces. The "cylindrical reflection surface" may have a curvature that slightly shifts from a perfectly cylindrical shape, and the "cylindrical reflection surface" in this embodiment covers such an imperfect cylindrical shape.

A pair of flat plane mirror (auxiliary mirrors) 215*a* and 215*b* whose reflection surfaces oppose to each other are arranged at end surfaces 214*b* at both sides parallel to the meridional line direction G of the second reflection integrator 214. A description will be given later of the operations of the flat plane mirrors 215*a* and 215*b*. Reference numeral "215" generalizes "215*a*," etc.

The light from the tertiary light source formed by the second reflection integrator 214 passes the aperture 216*a* in the aperture stop 216 directly or via the auxiliary mirrors 215. The aperture 216*a* of the aperture stop 216 defines a shape of the effective light source.

The third optical unit 217 is an arc shaping optical system configured to condense the light from the second reflection integrator 214 in an arc shape, and to superimpose light beams from the plurality of secondary light sources on the surface to be illuminated (or mask surface) via the flat plane mirror 218. The third optical unit 217 includes a convex mirror 217*a* and a concave mirror 217*b*, and forms an arc illumination area suitable for the illumination of the mask R.

The flat plane mirror 218 is a deflection member configured to introduce the light from the third optical unit 217 to the mask R at a predetermined angle.

The light that is divided and diverged by each cylindrical reflection surface 214*a* of the second reflection integrator 214 is condensed in an arc shape by the third optical unit 217, and forms an arc illumination area having a uniform luminous distribution on the opening 219*a* of the slit 219 and ultimately on the mask R surface. The center of curvature of the arc illumination area is set to an optical axis (central axis) AX1 of the projection optical system 230.

Figure 7:
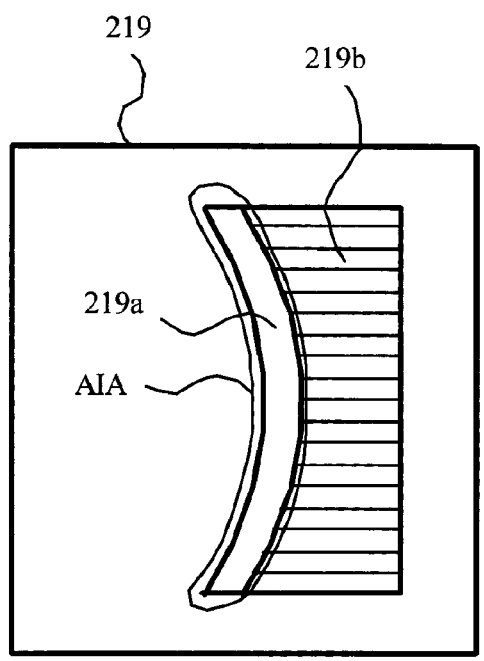
FIG. 7 is a plane view of a slit shown in FIG. 1.
Figure 7:
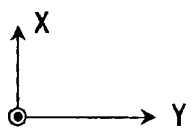

The slit 219 is a member that determines an illumination area on the mask R. As shown in a plane view shown in FIG. 7, the slit 219 has an arc opening 219*a*, and a movable part 219*b* configured to partially adjust a width of the opening 219*a*. In FIG. 7, AIA denotes an arc illumination area formed by the second reflection integrator 214 and the third optical unit 217. The illumination area AIA and the opening 219*a* determine the illumination area of the mask R.

In scanning exposure (of the step-and-scan manner), any luminance unevenness in the slit length direction X of the opening 219*a* causes the exposure unevenness. In order to solve this problem, a slit width is adjusted by using the movable part 219*b* in accordance with a position in the slit length direction X. This configuration provides an exposure with a uniform accumulated exposure dose on the entire surface of the exposure region. During the scanning exposure, the slit 219 is kept stationary relative to the projection optical system 230.

The mask (original) R is a reflection mask, on which a circuit pattern to be transferred is formed. The circuit pattern is formed on a multilayer mirror and a nonreflecting part made of a EUV absorber on it. The mask R is attached to the mask stage (original stage) 220 via a chuck, and driven in an arrow Y-axis direction by the mask stage 220 in FIG. 1.

The projection optical system 230 includes a plurality of (six in this embodiment) multilayer mirrors, and is designed so that an off-axis arc area off the optical axis AX1 can possess a good imaging characteristic. The projection optical system 230 is configured to be an image-side telecentric system. On the other hand, the projection optical system 230 is configured to be non-telecentric on the object side (mask R side) so as to avoid physical interference with the illumination light incident upon the mask R. For example, this embodiment inclines an object-side principal ray by about 6° relative to the normal direction of the mask R.

The diffracted light generated from the mask R reaches the wafer (substrate) W via the projection optical system 230, and a reduced image of the circuit pattern formed on the mask R is projected onto the wafer W. A wafer stage (substrate stage) 240 can support the wafer W via a chuck, and move the wafer W in the arrow Y-axis direction. Since the exposure apparatus 1000 of this embodiment is a step-and-scan type exposure apparatus, the mask R and the wafer W are scanned by the respective stages at a velocity ratio corresponding to a reduction ratio in exposing and transferring the circuit pattern onto the plate.

Figure 4:
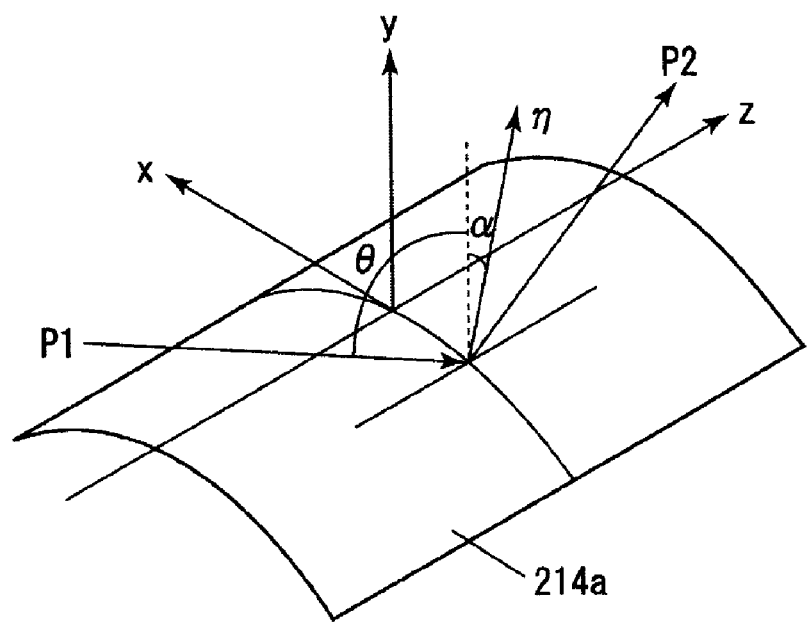
FIG. 4 is a partially enlarged perspective view of the second reflection integrator shown in FIG. 3A.
Figure 5:
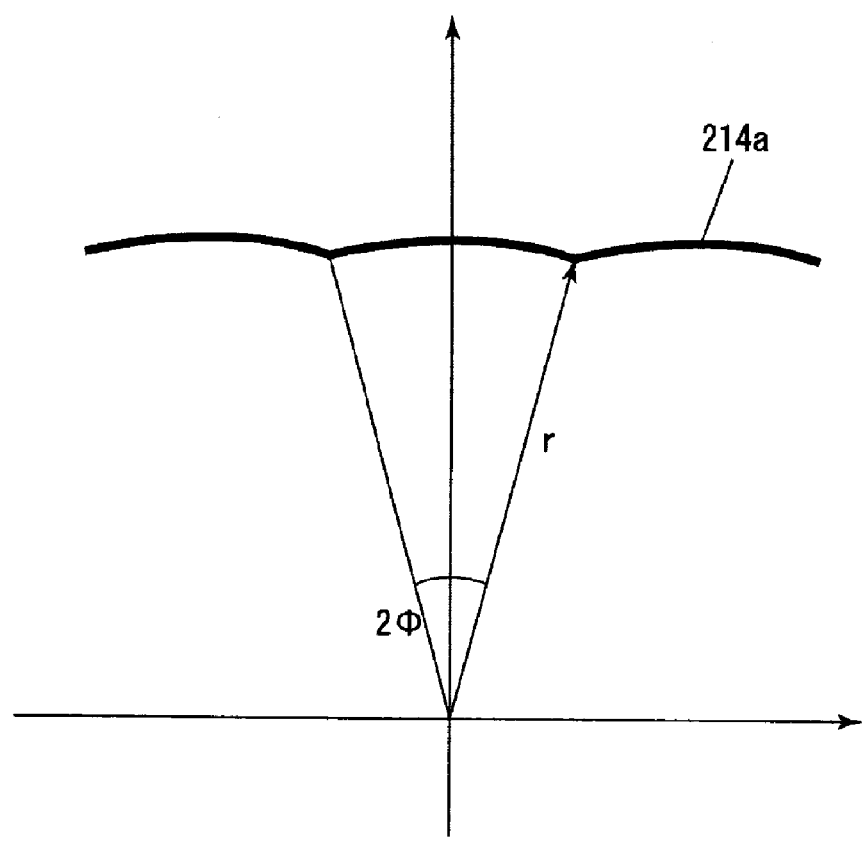
FIG. 5 is a sectional view for explaining an angular distribution of the light beam reflected on the cylindrical surface shown in FIG. 4.
Figure 6:
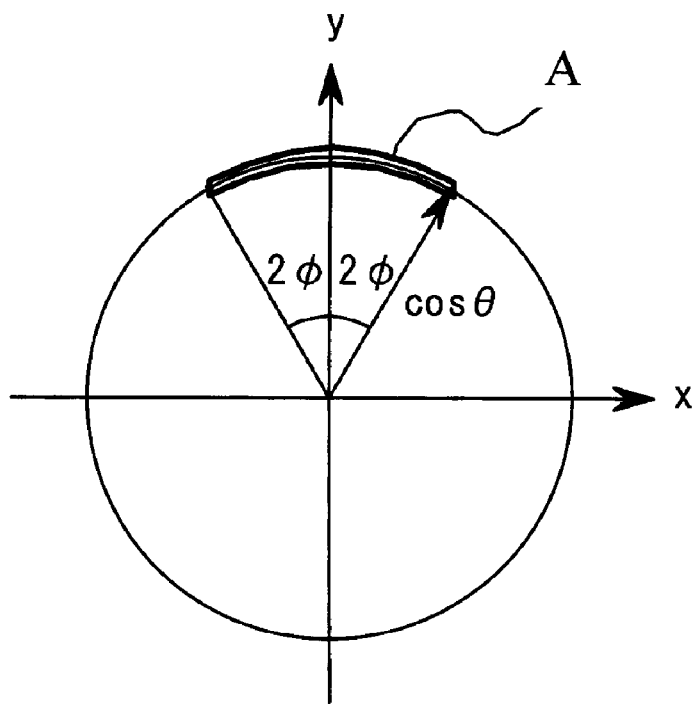
FIG. 6 is a view showing that an arc area is formed by the light beam reflected on the cylindrical surface shown in FIG. 5.

Referring now to FIGS. 3A to 6, a description will be given of a principle of a uniform illumination of the arc area by the second reflection integrator 214. FIGS. 3A and 3B are enlarged perspective views of the second reflection integrators 214, as described above. FIG. 4 is a partially enlarged perspective view for explaining a reflection of the EUV light on a convex cylindrical reflective surface 214*a*. FIG. 5 is a partially enlarged sectional view of the cylindrical reflection surface 214*a* shown in FIG. 4. FIG. 6 is a view showing an angular distribution of the EUV light reflected on the cylindrical reflection surface 214*a*.

As shown in FIG. 3A, when the collimated light IL enters the second reflection integrator 214 having a plurality of cylindrical reflection surfaces 214*a*, a linear light source that extends in the meridional line direction G is formed near the surface of the second reflection integrator 214. An angular distribution of the EUV light radiated from the linear light source forms a conical plane. Next, the third optical unit 217 that has a focal point at a position of the linear light source reflects the EUV light and illuminates the mask R or the surface conjugate with the mask R, realizing the arc illumination.

Referring to FIG. 4, a description will be given of a behavior of the reflected light when the illumination light IL enters one cylindrical reflection surface 214*a* in order to explain an operation of the second reflection integrator 214. Assume that the illumination light IL enters one cylindrical reflective surface 214*a* at an angle $\theta$ to a surface (or the xy plane) perpendicular to its center axis (or the z axis) A ray vector of the illumination light IL is defined as Equation 1, and a normal vector of the cylindrical reflective surface is defined as Equation 2:

$$P1 = (0, -\cos\theta, \sin\theta) \quad \quad \text{Equation 1}$$

$$n = (-\sin\alpha, \cos\alpha, 0) \quad \quad \text{Equation 2}$$

Then, a ray vector of the reflected light is defined as Equation 3:

$$P2 = (-\cos\theta \times \sin 2\alpha, \cos\theta \times \cos 2\alpha, \sin\theta) \quad \quad \text{Equation 3}$$

The ray vector of the reflected light plotted in the phase space forms a circle having a radius of $\cos\theta$ on the orthogonal coordinate system, as shown in FIG. 5. In other words, the reflected light becomes divergent light having a conical surface, and a secondary light source exists near a vertex of the conical plane. The secondary light source internally exists as a virtual image when the cylindrical reflection surface has a convex as shown in FIG. 3A, and an externally exists as a real image when the cylindrical reflection surface has a concave shape as shown in FIG. 3B. When the cylindrical reflection surface 214a is a part of the cylindrical surface and its central angle is 2φ as shown in FIG. 5, a ray vector P2 of the reflected light exists in an arc A having a central angle of 4φ on the xy plane, as shown in FIG. 6.

Next, assume that there is provided a rotational paraboloid mirror that has a focal length "f" with a focal point at a position of the secondary light source, and the surface to be illuminated is distant by "f" from this mirror. The light emitted from the secondary light source is converted into divergent light having a conical plane and then turned into collimated light after the divergent light is reflected on the mirror having the focal length f. The reflected light becomes a sheet beam having an arc section, a radius of f×cos θ, and a central angle of 4φ. Therefore, only the arc area A having a radius of f×cos θ and a central angle 4φ is illuminated on the surface to be illuminated as shown in FIG. 6.

Figure 8:
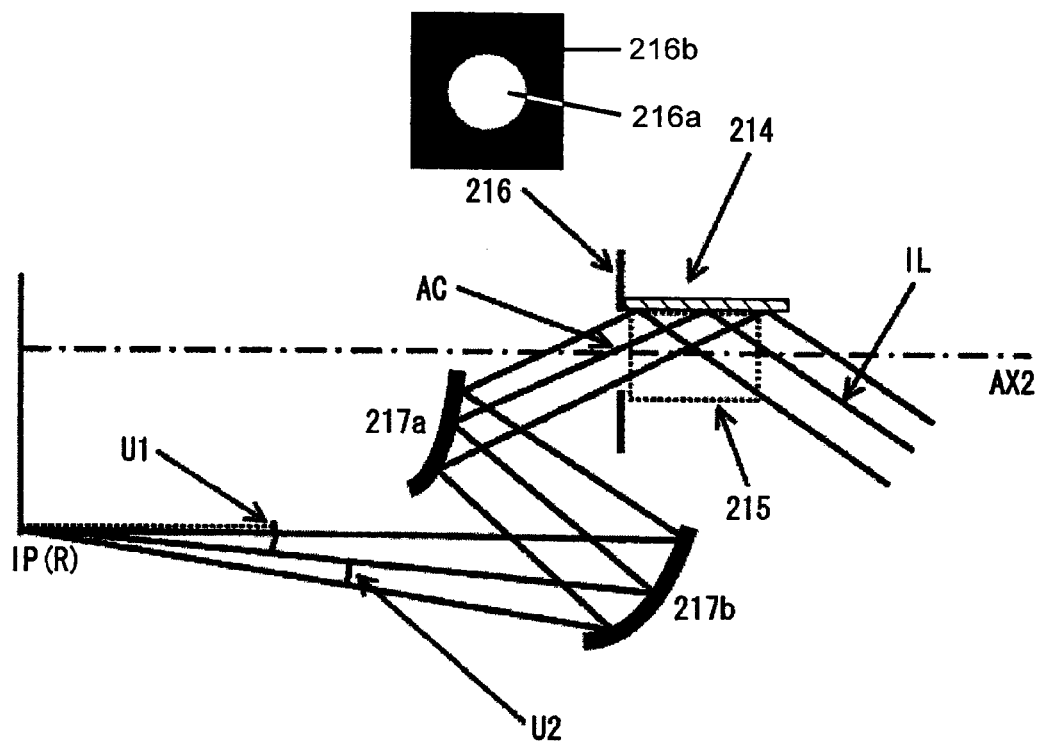
FIG. 8 is a partially enlarged sectional view near the second reflection integrator shown in FIG. 1.

While the behavior of the illumination light IL incident upon one cylindrical reflection surface has been discussed, a description will now be given of a behavior of the illumination light IL incident upon the second reflection integrator 214. FIG. 8 is a sectional view of the second reflection integrator 214, upon which the illumination light IL is incident. In FIG. 8, IP denotes a surface to be illuminated, which is equivalent with the mask surface.

The third optical unit 217 is a coaxial system having an axis AX2 as a central symmetrical axis. The third optical unit 217 maintains an optical Fourier transformation relationship between an aperture center AC of the aperture stop 216 and the surface to be illuminated IP. In other words, the aperture stop 216 corresponds to a pupil plane of the surface to be illuminated IP.

The third optical unit 217 is configured to be non-telecentric on the image side. An incident angle U1 of the image-side principle ray from the third optical unit 217 upon the surface to be illuminated IP is set to be equal to an inclination angle of an object-side principal ray of the projection optical system 230. The principal ray inclines in such a direction that an interval between the principal ray and the normal of the surface to be illuminated IP narrows as a distance to the illuminated surface IP reduces. For example, this embodiment sets the incident angle U1 to about 6°. In addition, the third optical unit 217 is appropriately corrected in blur on the surface to be illuminated IP so that a spot diameter can be 5 mm or smaller, or 1 mm or smaller.

The incident angle of the principal ray upon the convex mirror 217a and the concave mirror 217b in the third optical unit 217 is set to a low incident angle, more specifically 20° or smaller. This configuration makes smaller a blur amount that would otherwise occur in condensing the light upon the illuminated surface IP and provides more improved condensing efficiency upon the arc illumination area than the arc shaping optical system comprised of one rotational paraboloid surface. In addition, this configuration reduces the light loss that would otherwise occur due to light shielding by the slit 219, and improves the illumination efficiency.

An orientation of the arc of the arc illumination area inverts when the flat plane mirror 218 reflects and deflects the illumination light towards a direction of the mask R. In this case, the center of curvature of the arc illumination area is set to an intersection between the optical axis AX1 of the projection optical system 230 and the mask R. When the incident angle U1 is set as described above, the image-side principal ray of the third optical unit 217 can be accorded with the object-side principal ray of the projection optical system 230 before and after the mask R.

The angular distribution of the light reflected on each cylindrical reflection surface 214a in the second reflection integrator 214 is similar to that for a single cylindrical reflection surface. The light incident upon one point of the surface to be illuminated IP derives from the entire illumination region of the illumination light IL upon the second reflection integrator 214. The illumination light IL's angular spread (or condensing NA) U2 is expressed as follows, where "D" is a diameter of the luminous flux of the illumination light IL, and "f" is a focal length of the third optical unit 217.

$$U2=D/f \quad \text{Equation 4}$$

In the arc illumination area, respective luminous fluxes from a multiplicity of cylindrical reflection surfaces 214a are superimposed in a direction along the arc to achieve the luminance uniformity, thereby providing an efficient and uniform arc illumination.

Figure 9:
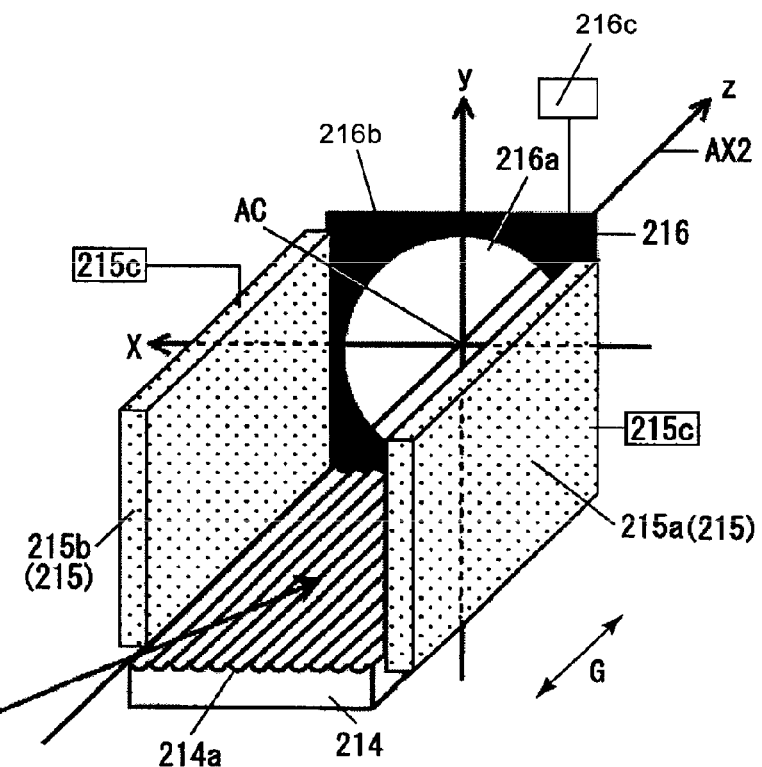
FIG. 9 is a perspective view near the second reflection integrator shown in FIG. 1.

Referring now to FIG. 9, a detailed description will be given of an arrangement of the second reflection integrator 214 and a pair of flat plane mirrors 215a and 215b provided at both sides of the second reflection integrator 214. In FIG. 9, IL1 denotes the principal ray in the illumination light IL incident upon the second reflection integrator 214. The principal ray IL1 passes through the yz section near the center of the second reflection integrator 214. AC denotes an aperture center of the aperture stop 216, as described above, and corresponds to the center of the pupil plane of the third optical unit 217. While the xyz coordinate is described with an origin at the aperture center AC, the z axis accords with the optical axis AX2 of the third optical unit 217. Thereby, different from the JP 2005-141158 (US 2005/0105290), the deformation of the effective light source can be restrained.

The auxiliary mirror 215 includes a pair of flat plane mirrors 215a and 215b that are arranged opposite to each other and parallel to the meridional line direction G of each cylindrical reflection surface 214a of the second reflection integrator 214 so as to hold the illumination area of the second reflection integrator 214. Although FIG. 9 is drawn so that the aperture mirrors 215 are fixed, there is an adjustment mechanism or unit 215c configured to adjust an interval between two flat plane mirrors 215a and 215b in accordance with the aperture shape of the aperture stop 216 as described later. The adjustment unit 215c moves a pair of flat plane mirrors 215a and 215b by an equal distance with respect to the aperture center AC in the X-axis direction as the aperture shape of the aperture stop 216 is switched so as to adjust an interval between them.

The aperture stop 216 is arranged on the exit side of the second reflection integrator 214 so that the aperture 216a can be perpendicular to the meridional line direction G of each cylindrical reflection surface 214a of the second reflection integrator 214. An aperture shape of the aperture stop 216 shown in FIG. 9 is an example of a circular opening used for a normal illumination mode. Such an aperture stop 216 includes an opening 216a through which the light passes, and a light shielding part 216b configured to shield the light.

For fine adjustments of the effective light source distribution, the aperture stop 216 may be arranged and slightly inclined by about 1° to 2°, rather than perfectly perpendicular to the meridional line direction of each cylindrical reflection surface 214a of the second reflection integrator 214. This embodiment also refers to the arrangement of the aperture stop 216, including such a slight inclination relative to the perpendicular, as a "perpendicular to the meridional line direction of the cylindrical reflection mirror." In addition, in order to make adjustable the effective light source distribution and the degree of the telecentricity, a driving mechanism configured to adjust an angle of the aperture stop 216 relative to the second reflection integrator 214 may be provided.

Next, an effect of the auxiliary mirror 215 will be described. This embodiment arranges the aperture stop 216 on the exit side of the second reflection integrator 214 in order to restrain the deformation of the effective light source distribution so that the optical axis of the third optical unit 217 passes the aperture center AC of the aperture stop 216. In this case, the conceivably simplest structure is a structure that arranges the aperture stop 216 after the second reflection integrator 214 without using any auxiliary mirrors 215, as shown in FIG. 10.

Figure 10:
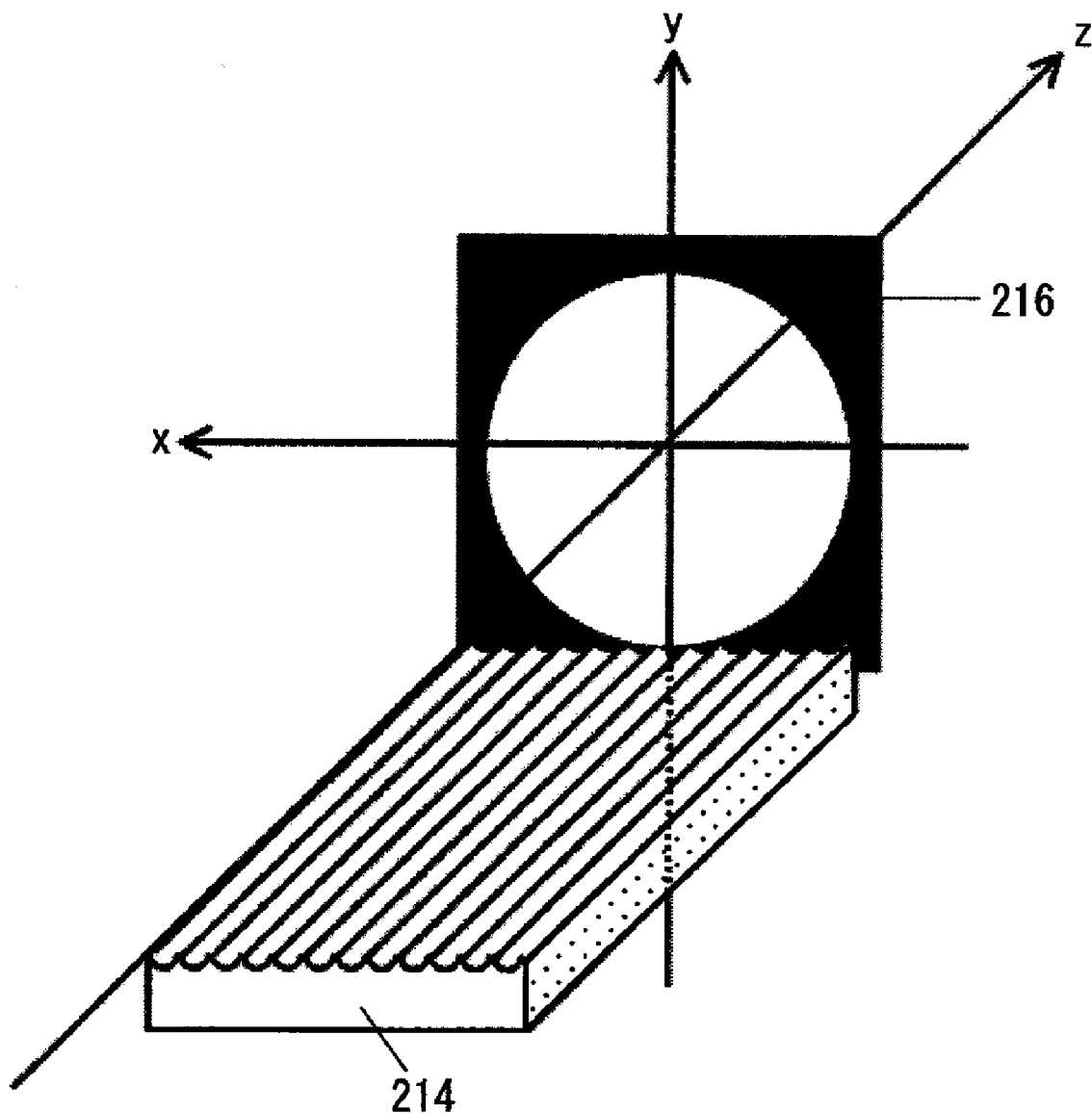
FIG. 10 is a perspective view when no auxiliary mirror shown in FIG. 9 is provided.

However, the structure shown in FIG. 10 has a problem. This problem will be described with reference to FIGS. 11-14. FIGS. 11-14 are plane views of the structure shown in FIG. 10 viewed from a direction perpendicular to the reflection surface of the second reflection integrator 214 (or from the top of the Y-axis direction), and omit, for simplicity, the third optical unit 217 between the second reflection integrator 214 and the arc illumination area AIA.

Figure 11:
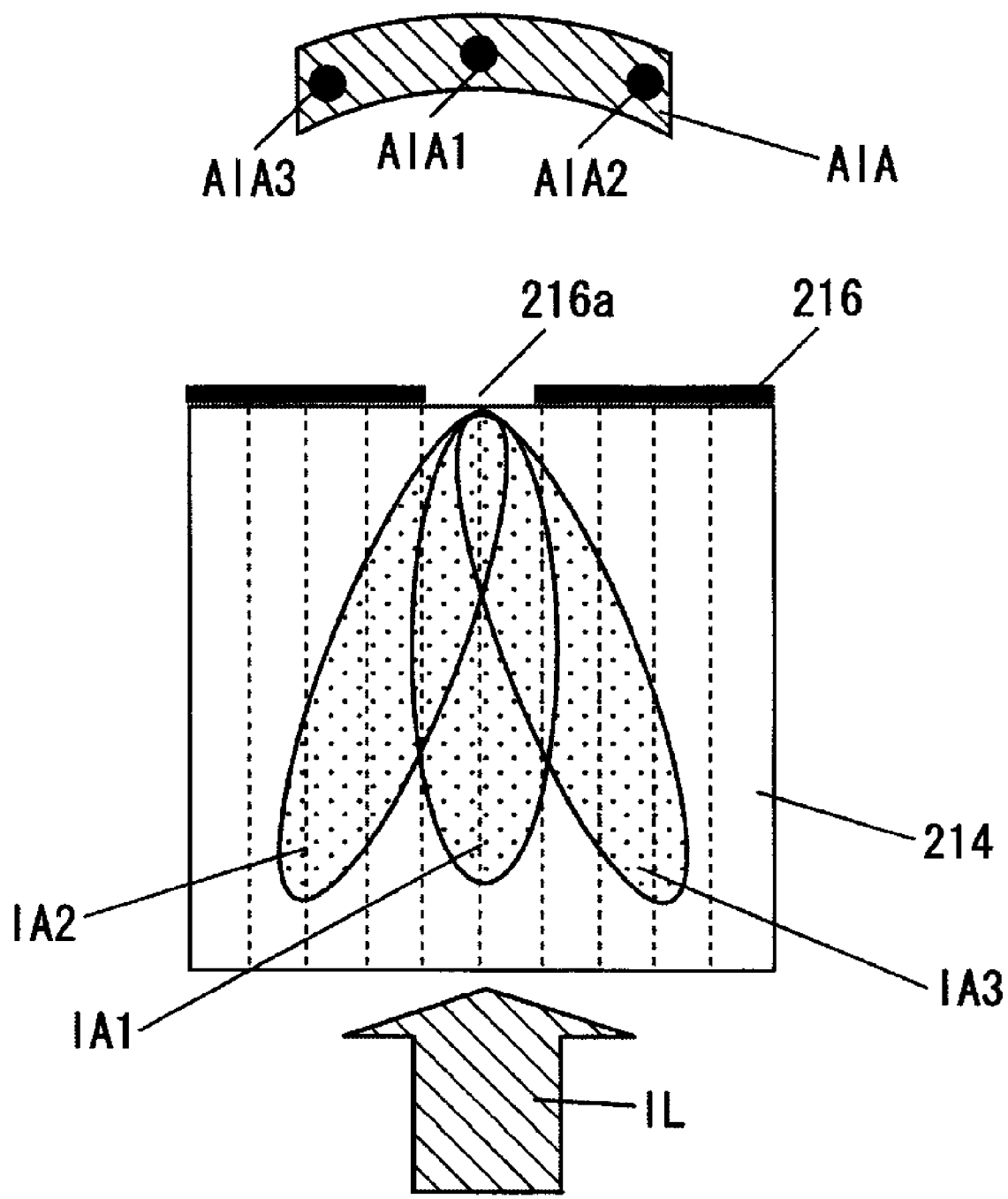
FIG. 11 is a plane view for explaining a problem of the structure shown in FIG. 10.

In FIG. 11, the illumination light IL from the second optical unit 213 illuminates the second reflection integrator 214 from the illustrated direction. IA1, IA2, and IA3 are areas onto which the illumination light IL is irradiated, so as to obtain a regular circle of the effective light source distribution at respective observation points AIA1, AIA2, and AIA3 of the illumination area AIA. The areas IA1, IA2, and IA3 extend in a radial shape from the center of the aperture stop 216.

Figure 12:
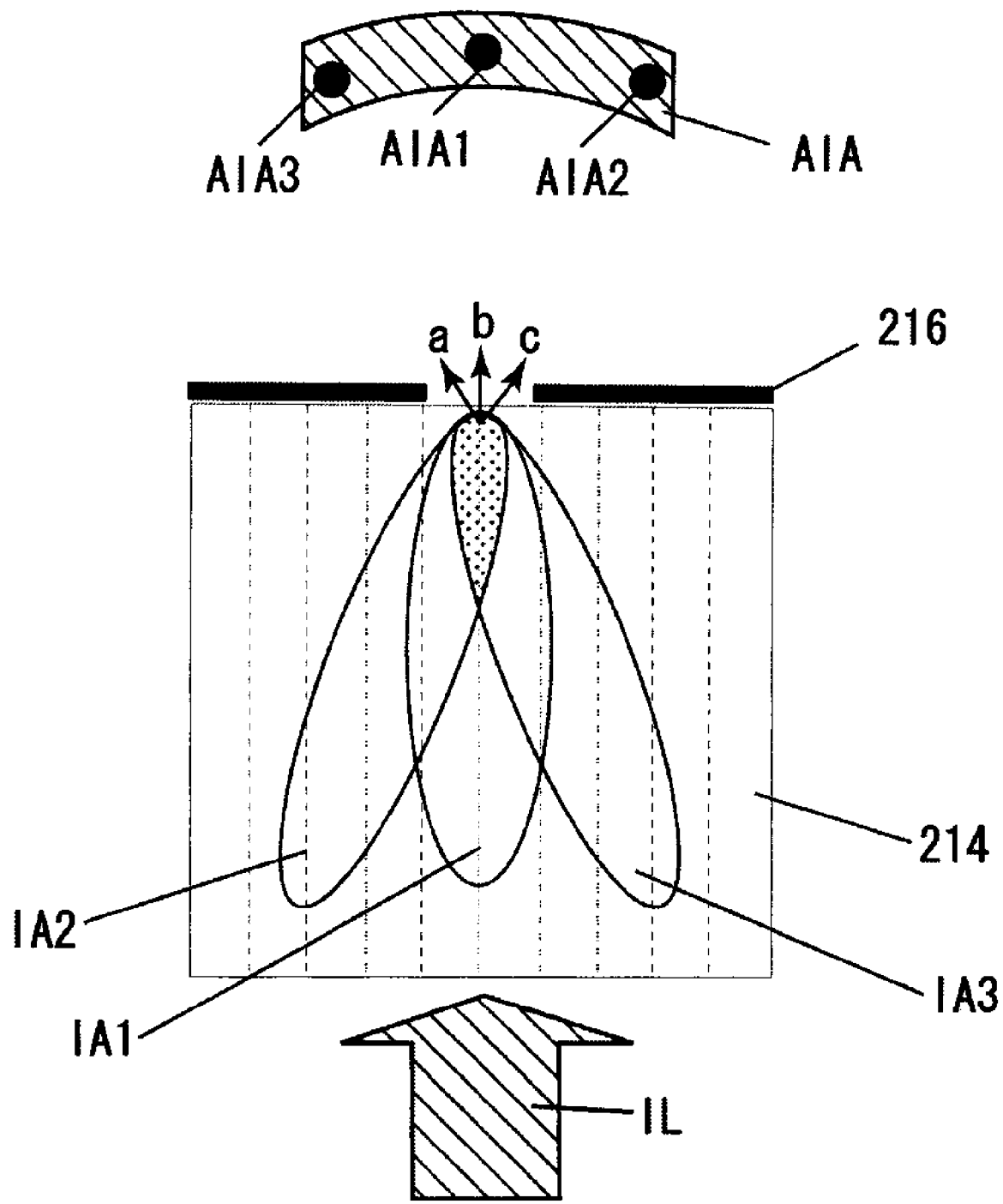
FIG. 12 is a plane view for explaining the problem of the structure shown in FIG. 10.
Figure 13:
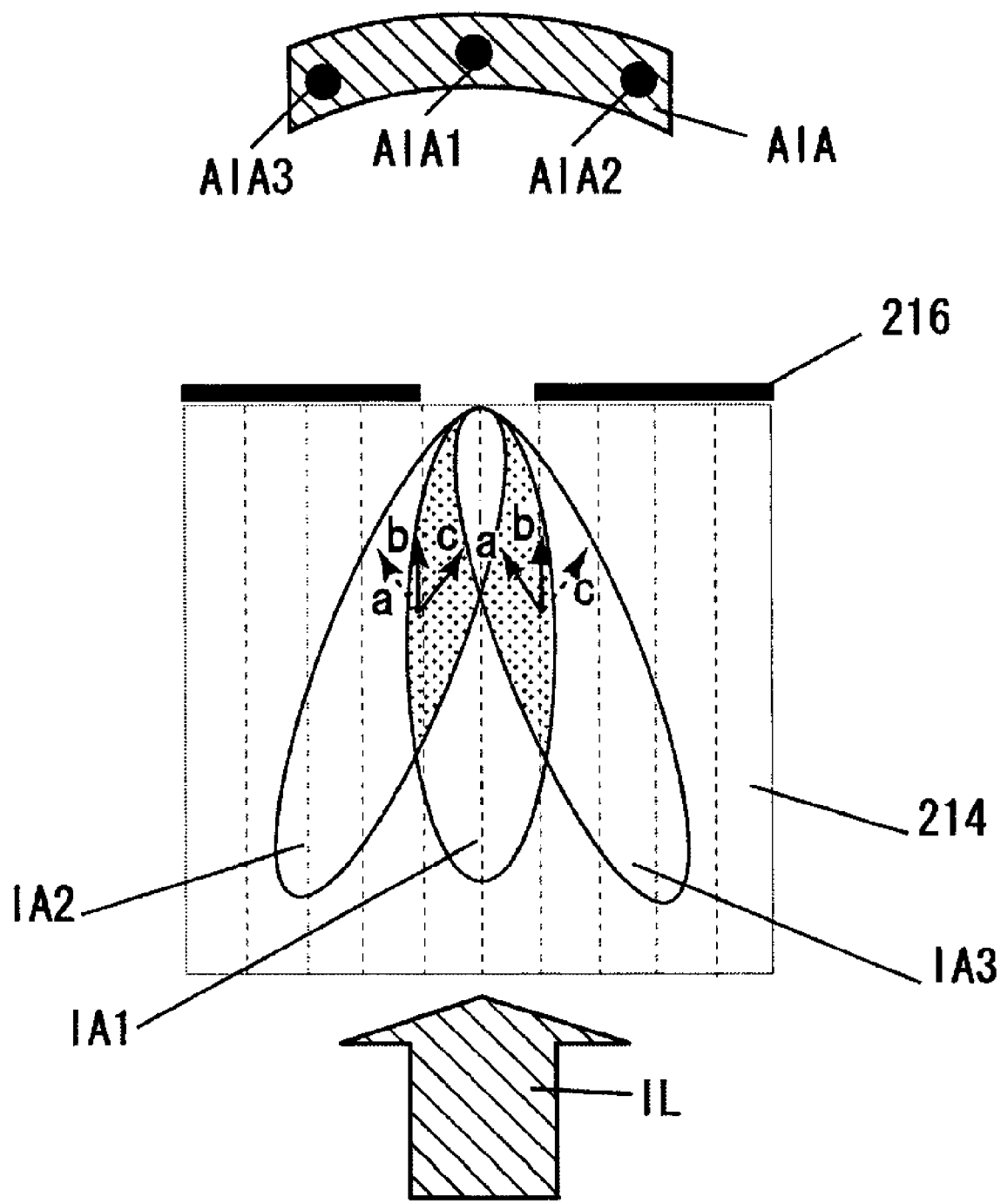
FIG. 13 is a plane view for explaining the problem of the structure shown in FIG. 10.
Figure 14:
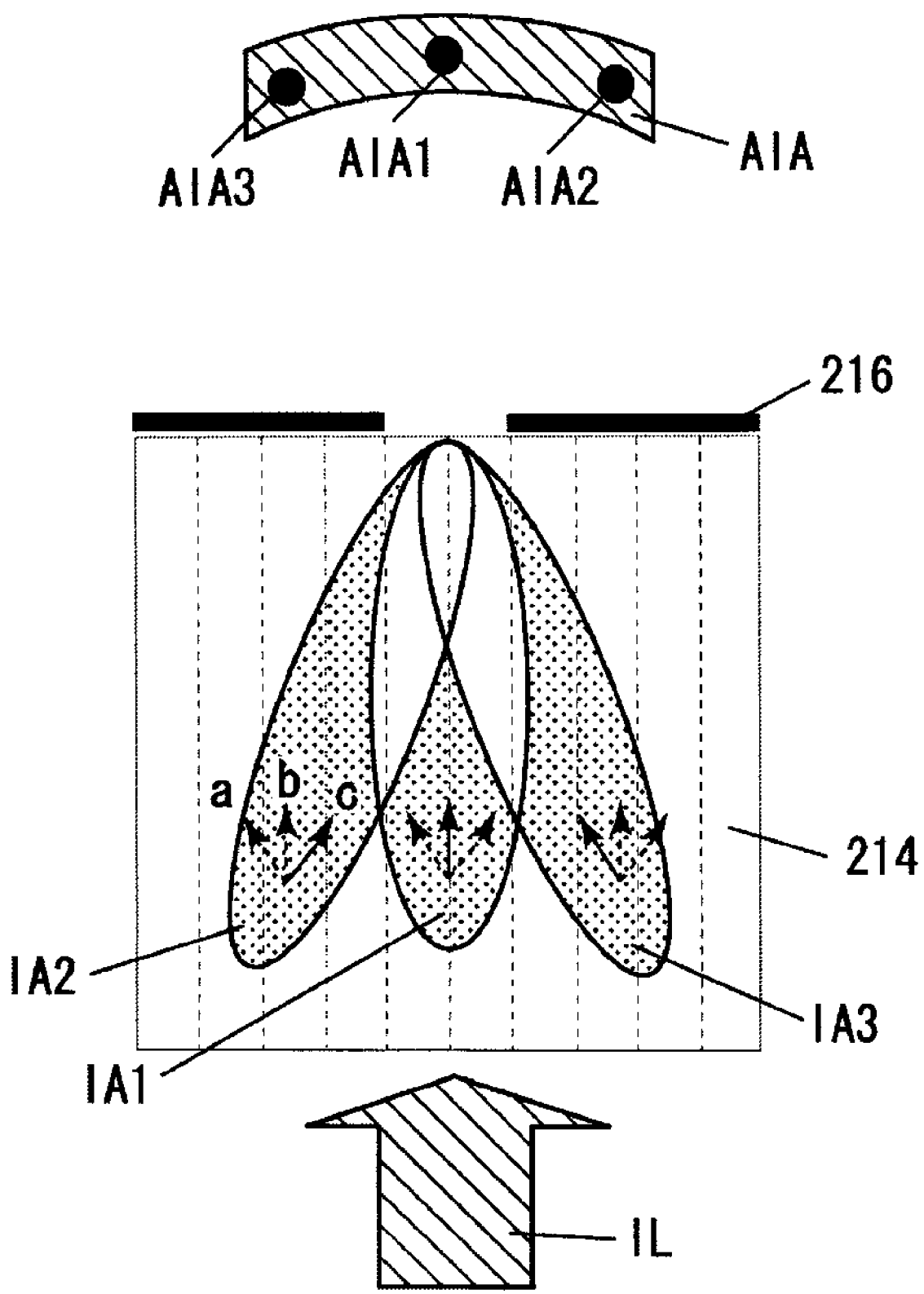
FIG. 14 is a plane view for explaining the problem of the structure shown in FIG. 10.

Overlapping of these areas is to be noted. Referring now to FIGS. 12-14, a description will be given of a relationship between overlapping of the areas IA1, IA2, and IA3, and a ray that passes the aperture 216a of the aperture stop 216.

Arrows in FIGS. 12-14 denote divergent light beams from the second reflection integrator 214, and "a," "b," and "c" are representative rays in three directions. In the rays "a," "b," and "c," a solid line denotes a ray used as the illumination light in the subsequent optical system, and a broken line denotes a ray that is shielded by the aperture stop 216 and is not used as the illumination light.

FIG. 12 shows an overlapping part among the areas IA1-IA3 near the aperture stop 216. It is understood that the divergent light from this part contributes to all the effective light source distributions at respective observation points AIA1-AIA3. In other words, the rays "a" to "c" from this part is effectively used as the illumination light.

As shown in FIG. 13, at a position slightly distant from the aperture stop 216, two areas overlap, and part of the divergent light from the second reflection integrator 214 is shielded by the aperture stop 216 and does not contribute to the illumination of the surface to be illuminated. More specifically, in the overlapping part between the areas IA1 and IA2 shown in FIG. 13, the rays "b" and "c" are used as the illumination light but the ray "a" is shielded by the aperture stop 216.

As shown in FIG. 14, at a position further distant from the aperture stop 216 in which the areas IA1 to IA3 do not overlap each other, most of the divergent light is shielded by the aperture stop 216, and only part of the light is used for the illumination light. More specifically, in the area IA2 shown in FIG. 14, only the ray "c" is used as the illumination light and the rays "a" and "b" are shielded by the aperture stop 216. This applies to other areas, only one of the rays "a," "b," and "c" is used for the illumination light.

Thus, the structure shown in FIG. 10 has a room to improve the light use efficiency, and thus this embodiment arranges a pair of auxiliary mirrors 215 at both sides of the second reflection integrator 214.

Figure 15:
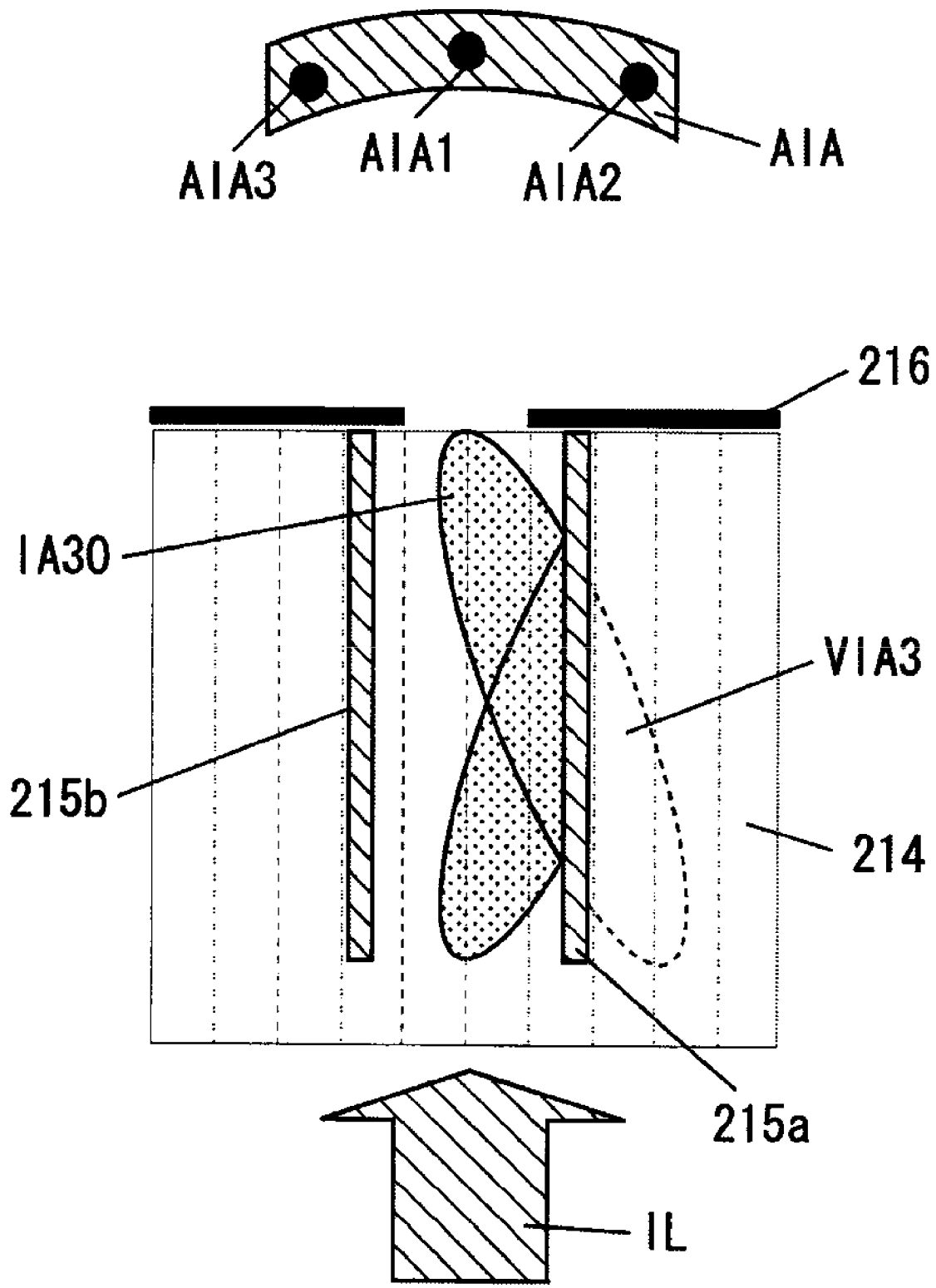
FIG. 15 is a plane view for explaining an effect of the auxiliary mirror shown in FIG. 9.
Figure 16:
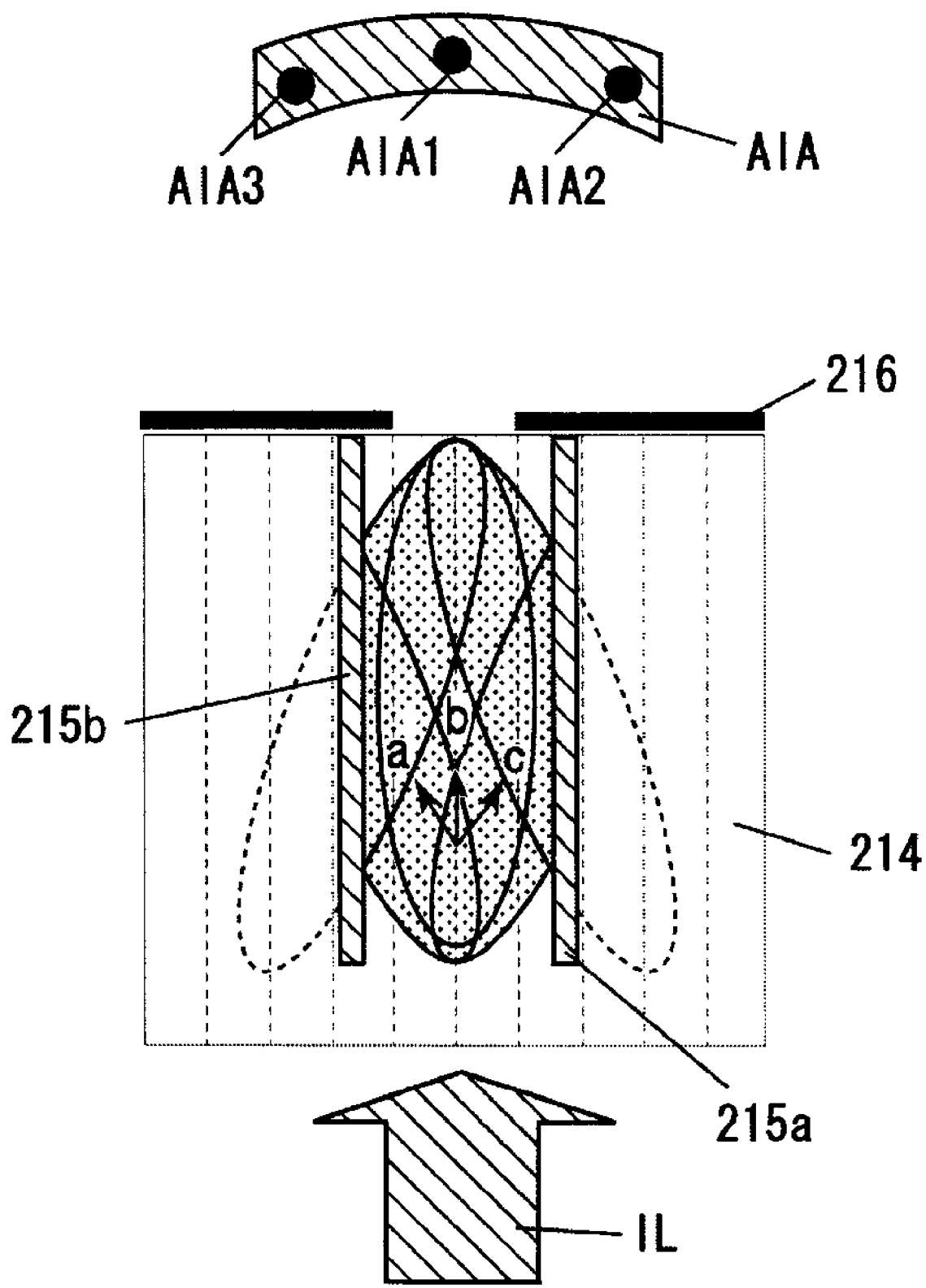
FIG. 16 is a plane view for explaining the effect of the auxiliary mirror shown in FIG. 9.

FIGS. 15 and 16 are plane views for explaining an effect of the auxiliary mirrors 215. When there is no auxiliary mirror 215, the area VIA3 enclosed by the broken line or the structure shown in FIG. 12 is an illumination area of the illumination light IL necessary for the effective light source distribution to have a regular circle at the observation point AIA3, and corresponds to the area IA3 in FIG. 11. In FIG. 15, the flat plane mirror 215a exists and the area IA30 shown by the solid line is the illumination area of the illumination light IL necessary for the effective light source to have a regular circle. The flat plane mirrors 215a shape the illumination area necessary to restrain the distortion of the effective light source into a fold shape, rather than a radially extending shape from the aperture stop 216 shown in FIG. 11.

This is true of the observation point AIA2. The illumination area necessary for the respective observation points AIA1 to AIA3 to have a regular circle of the effective light source distribution becomes an area held by the auxiliary mirrors 215, as shown in FIG. 16. It is understood that when there are auxiliary mirrors 215, the irradiation region of the illumination light IL upon the second reflection integrator 214 may be narrower than the structure shown in FIG. 11. In addition, the rays "a" and "c" shown in FIG. 16 are shielded by the aperture stop 216 in the structure shown in FIG. 11, and are not used for the illumination light for the subsequent optical system, whereas due to the auxiliary mirrors 215, they can be used for the illumination light without being shielded by the aperture stop 216. As a result, among the illumination light IL, a ratio of the rays used to illuminate the surface to be illuminate IP increases and the light use efficiency improves.

Thus, the light illumination efficiency of the surface to be illuminated IP improves by arranging a pair of flat plane mirrors 215a and 215b opposite to each other and parallel to the meridional line direction G of the cylindrical reflection surface 214a so as to hold the irradiation area of the illumination light IL and consequently a plurality of linear light sources. An interval between the flat plane mirrors 215a and 215b can be equal to or larger than the outermost diameter of the aperture 216a of the aperture stop 216 so as to improve the light use efficiency.

A description will now be given of a method of changing a coherence factor σ as the aperture stop 216 is switched. Since the apertures stop 216 and the pupil plane of the projection optical system 230 have a conjugate relationship, the aperture shape of the aperture stop 216 or the transmission pattern of the light corresponds to the distribution of the pupil plane in the projection optical system 230. FIGS. 17A-17E are views showing illustrative aperture shapes of the aperture stop 216. More specifically, FIG. 17A shows a large σ illumination of the normal illumination (or a usual circular illumination that is not a modified illumination). FIG. 17B shows a small σ illumination of the usual circular illumination. FIG. 17C shows a dipole illumination. FIG. 17D shows a quadrupole illumination. FIG. 17E shows an annular illumination. Such several aperture patterns are, for example, prepared and arranged in a row, and switched by an aperture stop driving system 216c shown in FIG. 9 so as to set a desired coherence factor σ. Thus, the aperture stop driving system 216c serves as a second selector configured to arrange one of the plurality of aperture stops 216 on the optical path. A unit configured to make an aperture shape variable by changing an aperture diameter in one aperture stop may be used. In other words, the unit configured to make the aperture shape of the aperture stop variable may change the aperture shape of one aperture stop or may switch a plurality of aperture stops having different aperture shapes.

Next, a description will be a method of changing the large σ illumination to the small σ illumination in the normal illumination.

Figure 18:
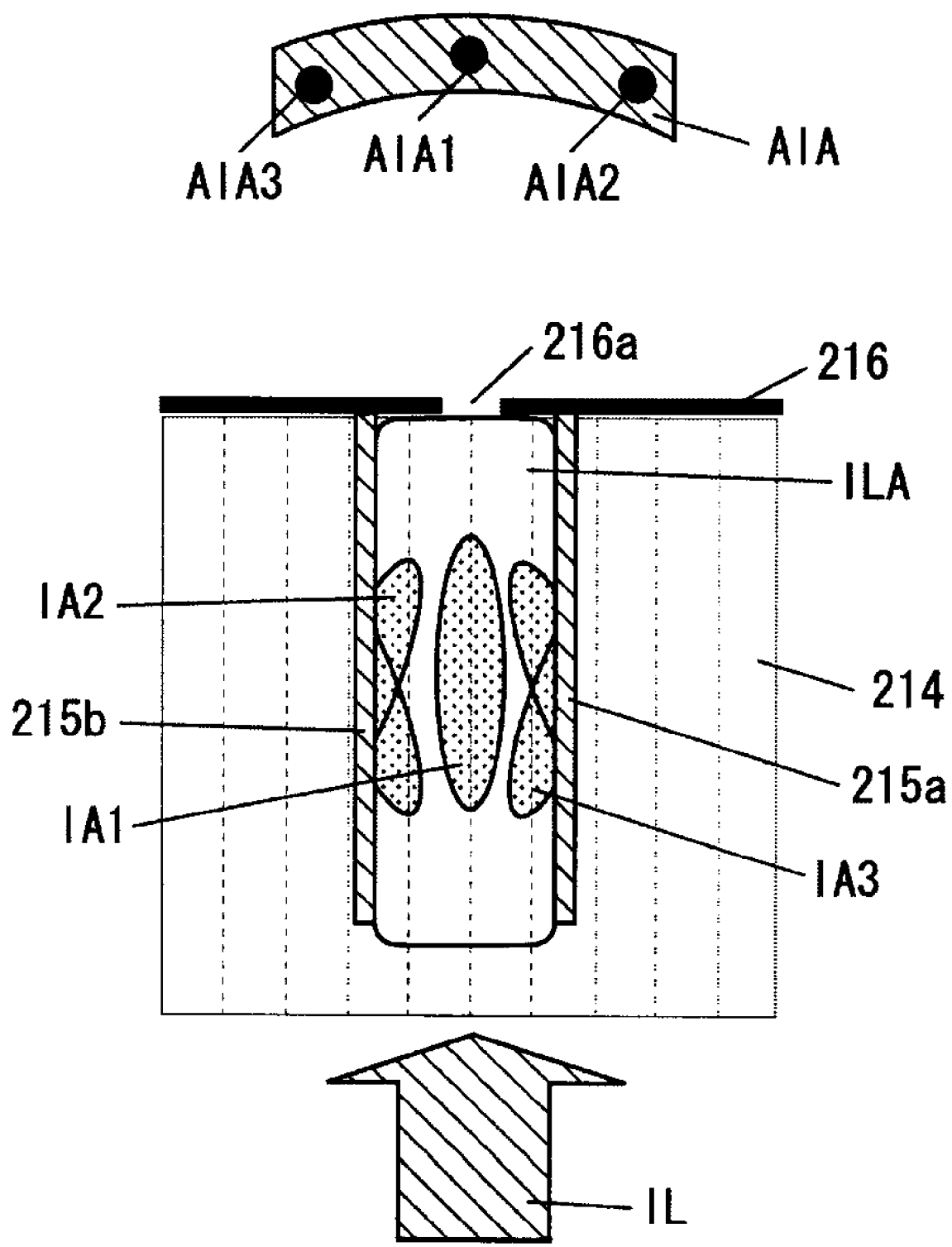
FIG. 18 is a plane view showing a parallel light irradiation area when the aperture stop shown in FIG. 1 uses a small σ aperture stop.

FIG. 18 is a plane view of the second reflection integrator 214 viewed from a direction perpendicular to its reflection surface when only the aperture stop 216 is changed so as to change the coherence factor σ from large σ to small σ. IA1, IA2, and IA3 are areas onto which the illumination light IL is irradiated, so as to obtain a regular circle of the small σ effective light source distribution at respective observation points AIA1, AIA2, and AIA3 of the illumination area AIA. The areas IA1, IA2, and IA3 do not overlap each other and the light use efficiency is low. This is because the aperture 216a of the aperture stop 216 is distant from the second reflection integrator 214 and does not match the outer diameter of the aperture stop 216 (in the Y-axis direction). In addition, the illumination area ILA by the illumination light IL spreads over the part that does not contribute to the illumination of the mask R or does not include the areas IA1, IA2, and IA3, and thus the light use efficiency becomes low.

Figure 19A:
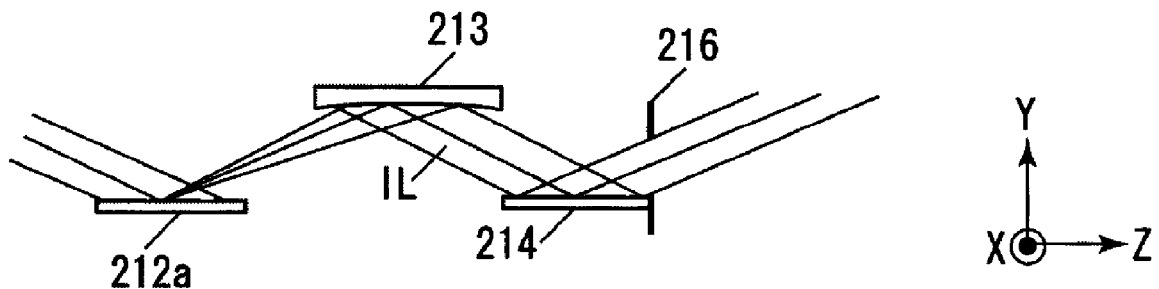
FIGS. 19A-19C are views for explaining effects when the divergent angle of the first reflection integrator and the position of the second reflection integrator are changed and the aperture stop is switched to one that uses small σ.
Figure 19B:
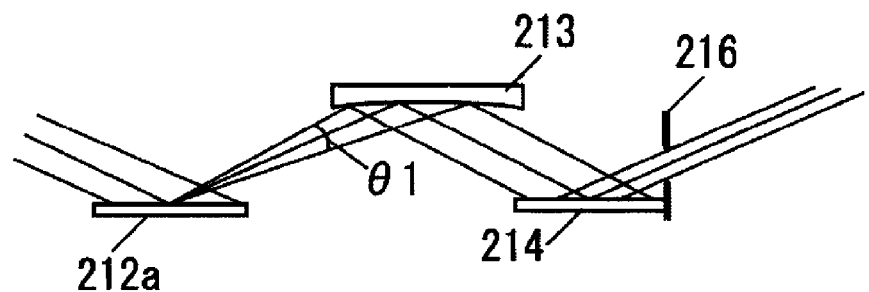
Figure 19C:
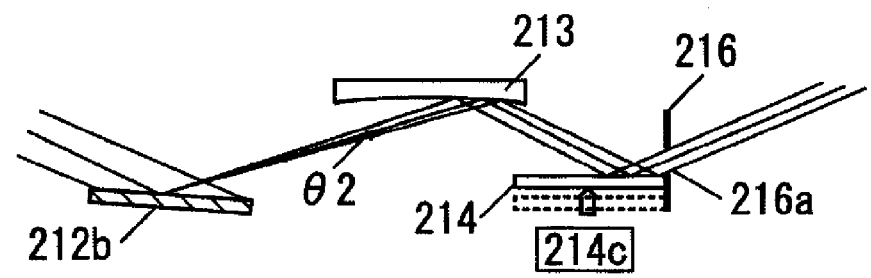

FIGS. 19A-19C are sectional views each showing a relationship among the first reflection integrator 212, the second reflection integrator 214, and the aperture stop 216. More specifically, FIG. 19A is a sectional view showing a relationship among them when the aperture stop 216 corresponding to the large σ illumination shown in FIG. 17A is used. FIG. 19B is a sectional view showing a relationship among them when the aperture stop 216 corresponding to the small σ illumination shown in FIG. 17B is used. FIG. 19C is a sectional view showing a relationship among them when the small σ aperture stop 216 is used in FIG. 19B and the divergent angle of the first reflection integrator 212 and the Y-axis position of the second reflection integrator 214 are changed. It is understood that FIG. 19C is different from FIG. 19B, and the minimum necessary area of the second reflection integrator 214 can be illuminated by changing the divergent angle of the second reflection integrator from θ1 to θ2 where θ1>θ2 is met. This embodiment changes the divergent angle by changing the first reflection integrator between 212a and 212b having different curvatures by the exchange unit 212c.

In addition, FIG. 19C is different from FIG. 19B, and the movement unit 214c moves the second reflection integrator 214 in the Y-axis direction so that the illumination area can match the outer diameter of the aperture 216a of the aperture stop 216 (in the Y-axis direction). This configuration provides a structure that proportionally reduces a positional relationship among the illumination light IL, the reflection integrator 214, and the aperture stop 216 in FIG. 19A.

Figure 20:
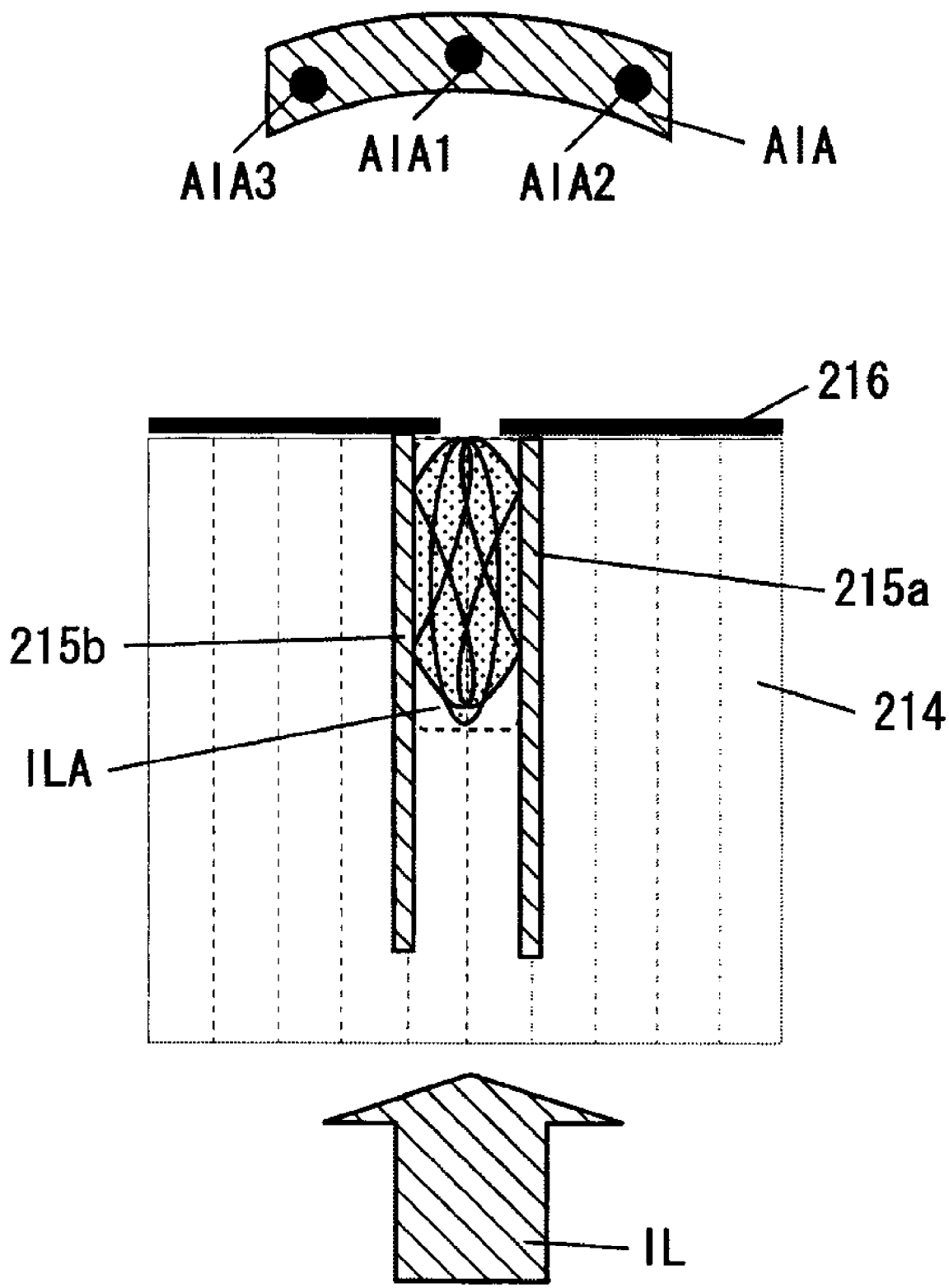
FIG. 20 is a plane view of FIG. 19C.

FIG. 20 is a plane view of the structure shown in FIG. 19C viewed from a direction perpendicular to the reflection surface of the second reflection integrator 214. In FIG. 20, an interval between the flat plane mirrors 215a and 215b is set equal to or slightly larger than the outermost diameter of the aperture 216a of the aperture stop 216 so that the illumination area can match the outer diameter of the aperture 216a of the aperture stop 216 (in the X-axis direction). As understood from FIG. 20, the illumination area necessary for the respective observation points AIA1 to AIA3 to have a regular circle of the effective light source distribution corresponds to a proportionally reduced area of the illumination area when the large σ aperture stop 216 shown in FIG. 16 is used. This configuration can change the large σ to small σ without deteriorating the light use efficiency.

A description will now be given of a method of changing the aperture stop 216 to one that corresponds to the dipole illumination shown in FIG. 17C.

Figure 21:
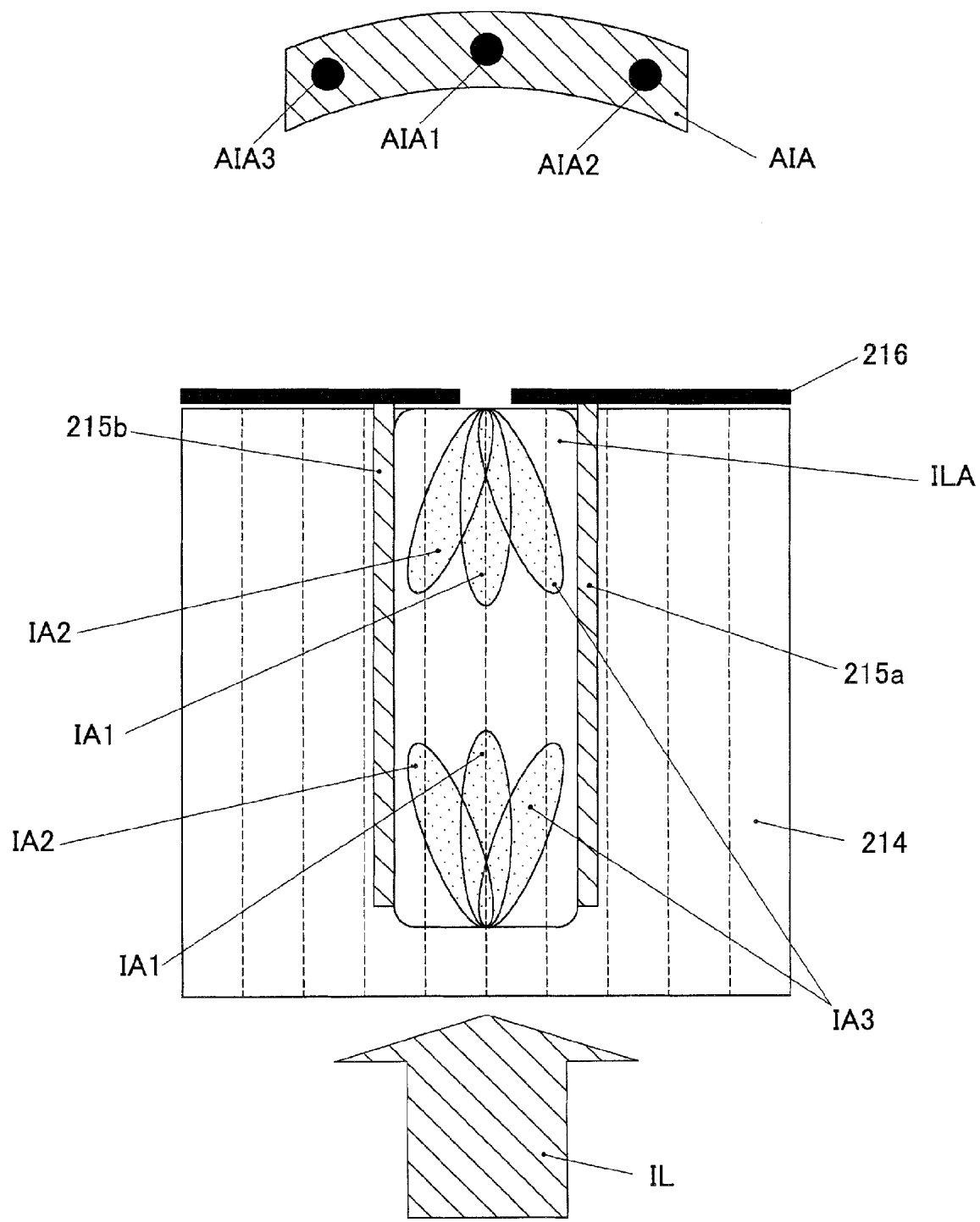
FIG. 21 is a plane view when the large σ illumination is changed to the dipole illumination and only the aperture stop is changed.

FIG. 21 is a plane view of the second reflection integrator 214 viewed from a direction perpendicular to its reflection surface when only the aperture stop 216 is changed so as to change the coherence factor σ from the large σ illumination to the dipole illumination. IA1, IA2, and IA3 are areas onto which the illumination light IL is irradiated so that the effective light source distribution at each of the respective observation points AIA1, AIA2, and AIA3 of the illumination area AIA can be a dipole illumination.

As understood from FIG. 21, there are two areas onto which the illumination light IL is irradiated for the dipole illumination, and the large σ first reflection integrator 212 illuminates an unnecessarily wide area. Thus, the light use efficiency can be improved by exchanging the first reflection integrator 212. In addition, the areas IA1, IA2, and IA3 little overlap each other and the light use efficiency is low. This is because the auxiliary mirrors 215 are spaced at the same interval as that for the large σ illumination, and the illumination area does not correspond to the outer diameter of the aperture stop 216 of the dipole illumination (in the X-axis direction). Therefore, the interval between the auxiliary mirrors 215 can be made narrower similar to a case where the large σ illumination is changed to the small σ illumination.

Figure 22A:
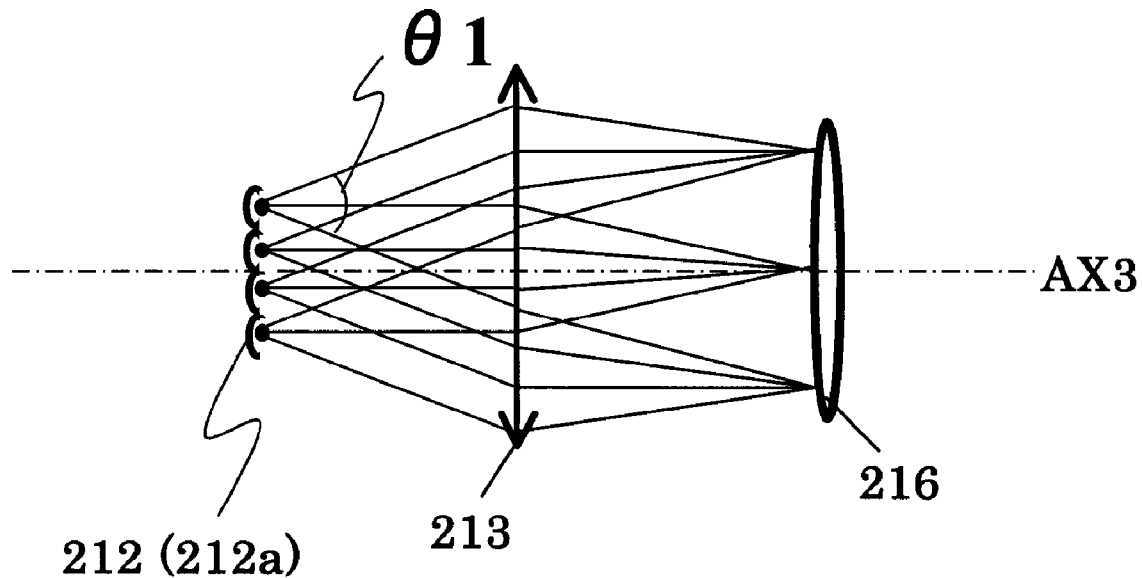
FIGS. 22A-22B are sectional views when an optical system from the first reflection integrator to the aperture stop is expressed as a dioptric optical system in the large σ illumination and in the dipole illumination.
Figure 22B:
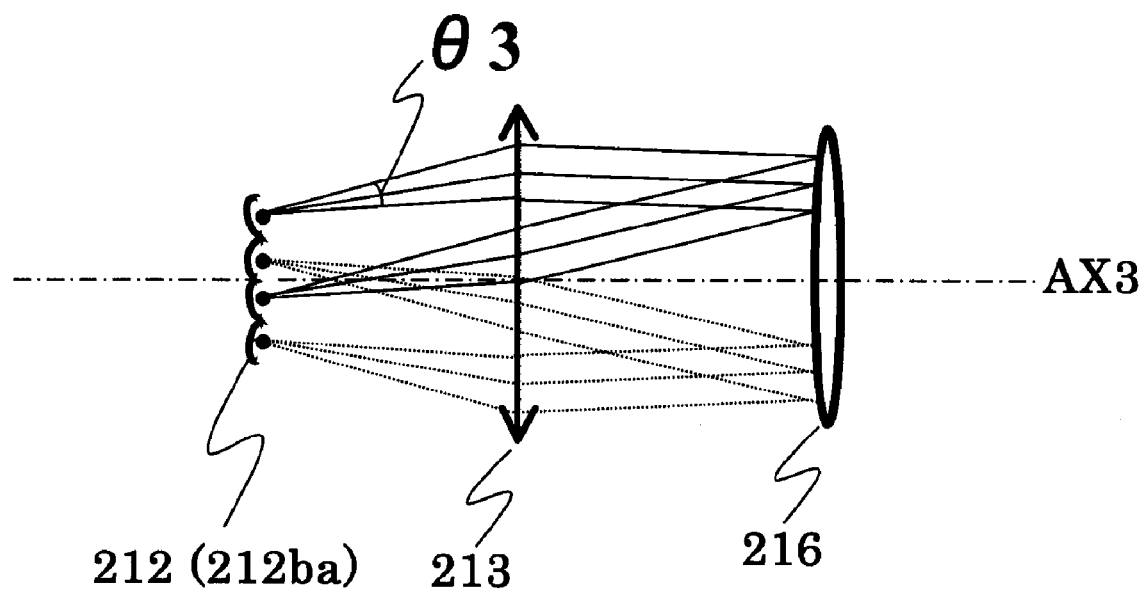

FIGS. 22A-22B are sectional views each of which expresses as a dioptric optical system from the first reflection integrator 212 to the aperture stop 216, and omits the second reflection integrator 214 but the it is considered to approximately accord with the aperture stop 216.

FIG. 22A shows a large σ illumination. FIG. 22A shows the first reflection integrator 212 uses the first reflection integrator 212a for the large σ illumination having a divergent angle θ1. In FIG. 22A, the center rays emitted from the secondary light sources formed by the first reflection integrator 212a are emitted approximately parallel to the optical axis AX3 and superimposed on the aperture stop 216.

FIG. 22B shows a dipole illumination. FIG. 22B shows that the first reflection integrator 212 has a divergent angle θ3, and uses a first reflection integrator 212ba for the dipole illumination which includes a plurality of pairs of angled devices. The center rays emitted from the secondary light sources formed by the first reflection integrator 212ba have two different angles relative to the optical axis AX3 since each device in the first reflection integrator 212ba has two angles, and thus are superimposed on and illuminate two areas on the aperture stop 216. As shown in FIG. 22B, in order to provide the center ray emitted from the secondary light source with two angles different from the optical axis AX3, the devices in the first reflection integrator 212ba may be provided with two inclination angles (deflection operations), as shown in FIGS. 23A-23B.

Figure 23A:
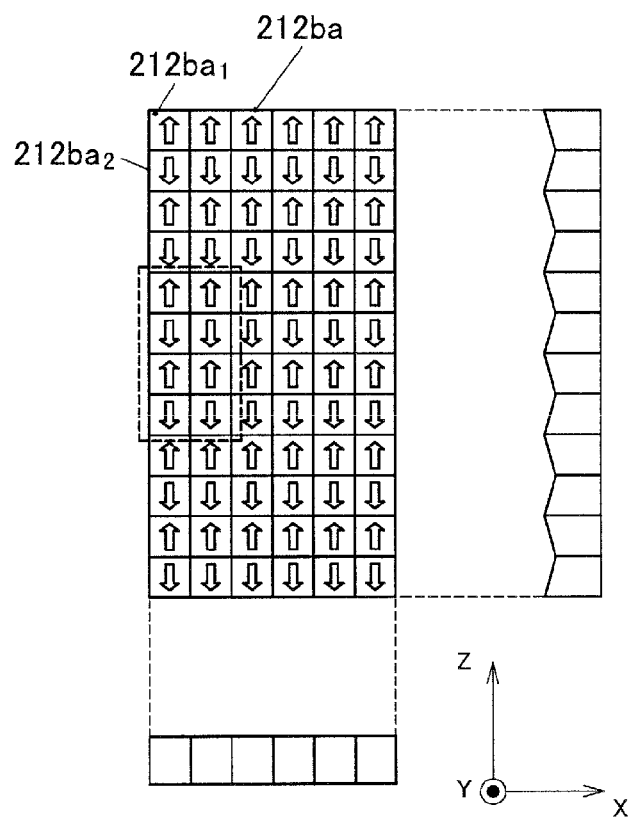
FIGS. 23A-23B are plane, sectional, and partially enlarged perspective views of the first reflection integrator shown in FIG. 22B.

FIG. 23A is a plane view of the first reflection integrator 212ba viewed from the Y-axis direction perpendicular to its reflection surface, a sectional view of it viewed from the horizontal or X-axis direction at the right side of FIG. 23A, and a sectional view of it viewed from the depth direction or Z-axis direction at the bottom side of FIG. 23A. FIG. 23B is a partially enlarged perspective view of a part enclosed by a dotted line in FIG. 23A.

The first reflection integrator 212ba has a divergent angle θ3 different from the divergent angle θ1, as shown in FIG. 22B. In addition, the first reflection integrator 212ba has a plurality of pairs of devices 212ba1 and 212ba2 which form a sawtooth or mountain shape when the first reflection integrator 212ba is viewed from the X-axis direction, as shown in FIG. 23A, and each device is angled. In addition, the top surface of the device in the first reflection integrator 212ba is maintained level when the first reflection integrator 212ba is viewed from the Z-axis direction, as shown in FIG. 23A. As understood from FIG. 23B, each device in the first reflection integrator 212ba inclines so that it can heave in the arrow direction.

Figure 23B:
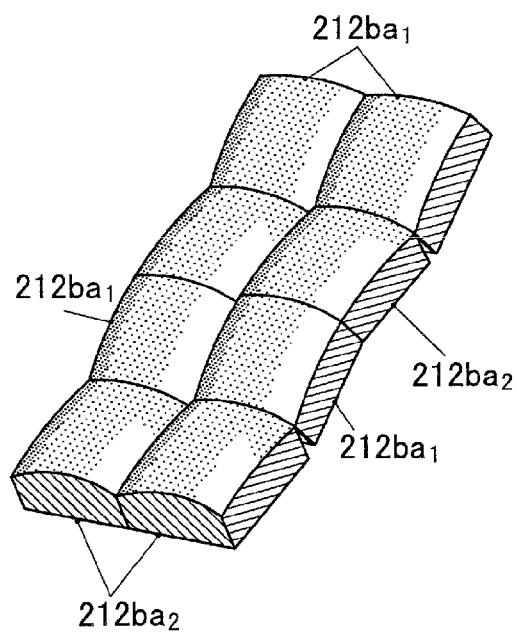
Figure 24:
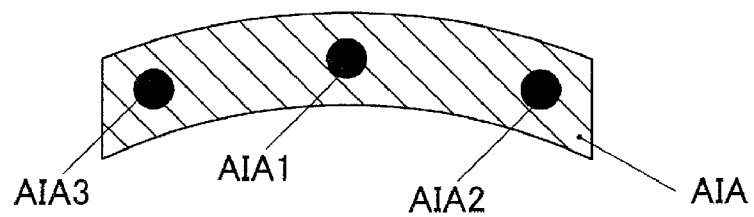
FIG. 24 is a plane view showing that the first reflection integrator shown in FIGS. 23A-23B is used for FIG. 21 and the interval between the auxiliary mirrors is narrowed to improve the light use efficiency.
Figure 24:
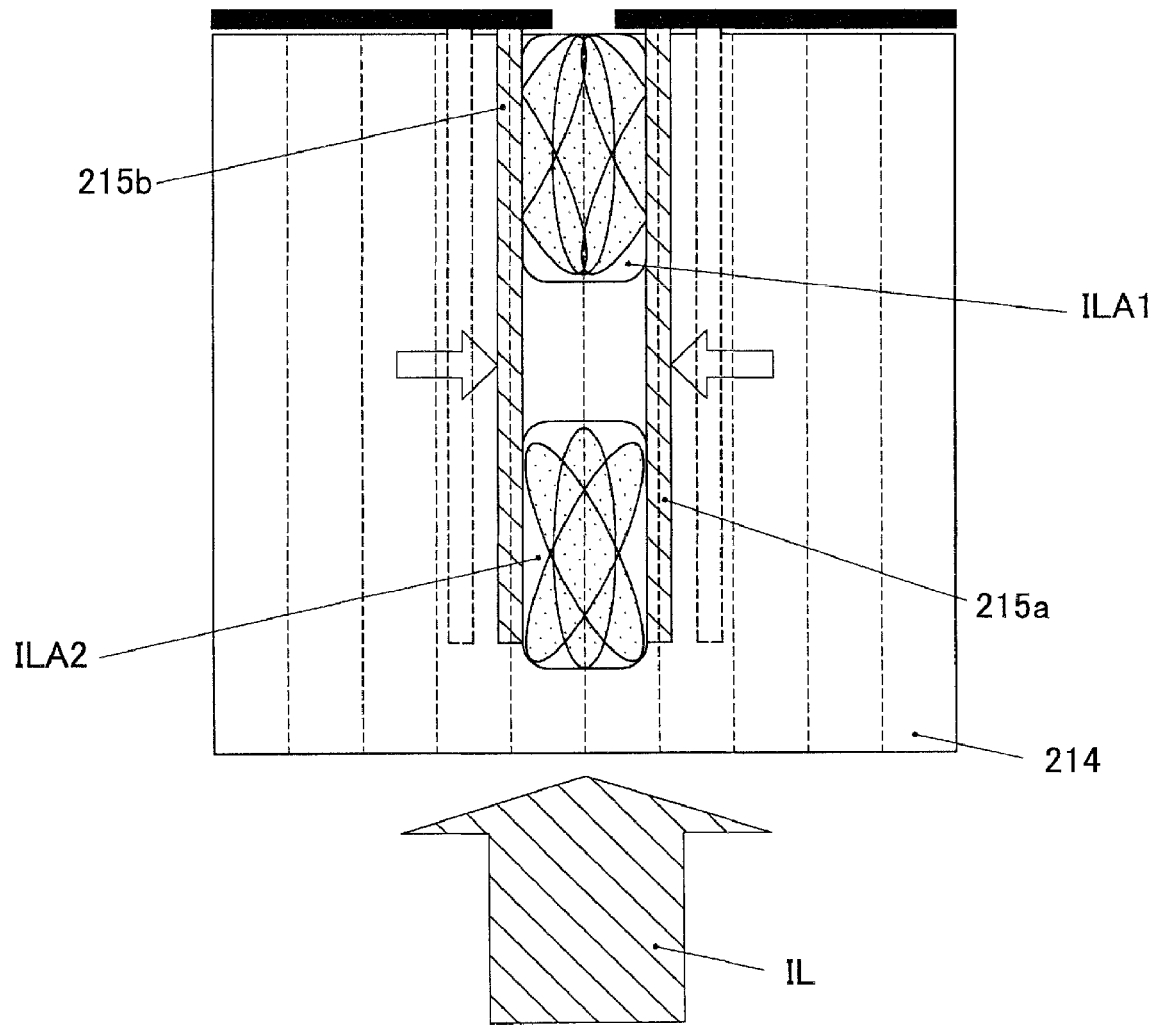

FIG. 24 is a plane view showing that the light use efficiency improves when the first reflection integrator 212ba shown in FIGS. 23A-23B is used and an interval between the auxiliary mirrors 215 is narrowed. As understood from FIG. 24, the areas ILA1 and ILA2 to be illuminated for the dipole illumination are efficiently illuminated. In addition, the interval between the auxiliary mirrors 215 match the outer diameter of the aperture stop 216 (in the X-axis direction), and overlapping areas among the IA1, IA2, and IA3 increase and the light use efficiency improves in comparison with FIG. 21.

Figure 25A:
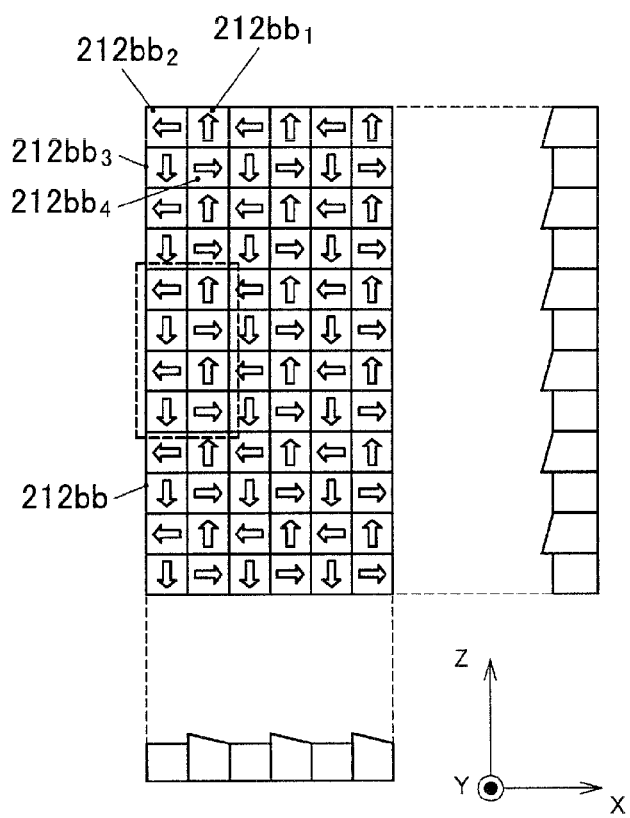
FIGS. 25A-25B are plane, sectional, and partially enlarged perspective views of the first reflection integrator for the quadrupole illumination.
Figure 25B:
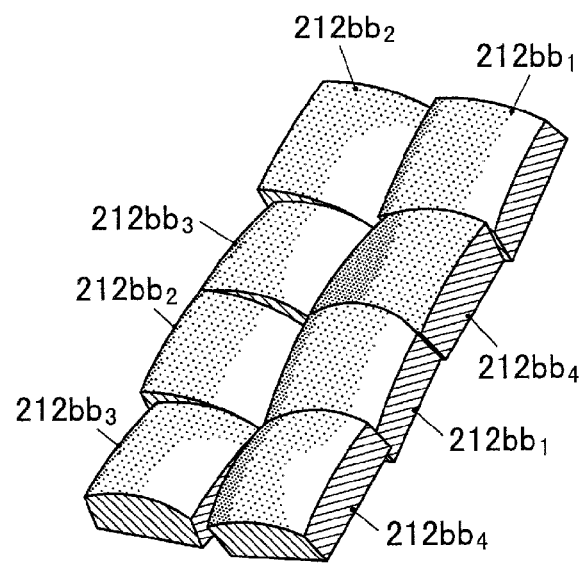

In using the aperture stop 216 having the quadrupole shape shown in FIG. 17D, the first reflection integrator 212 may use a first reflection integrator 212bb shown in FIGS. 25A-25B. The first reflection integrator 212bb provides four different inclination angles (deflection operations) to the plurality of devices.

FIG. 25A is a plane view of the first reflection integrator 212ba viewed from the Y-axis direction perpendicular to its reflection surface, a sectional view of it viewed from the horizontal or X-axis direction at the right side of FIG. 25A, and a sectional view of it viewed from the depth direction or Z-axis direction at the bottom side of FIG. 25A. FIG. 25B is a partially enlarged perspective view of a range enclosed by a dotted line shown in FIG. 25A.

Figure 26:
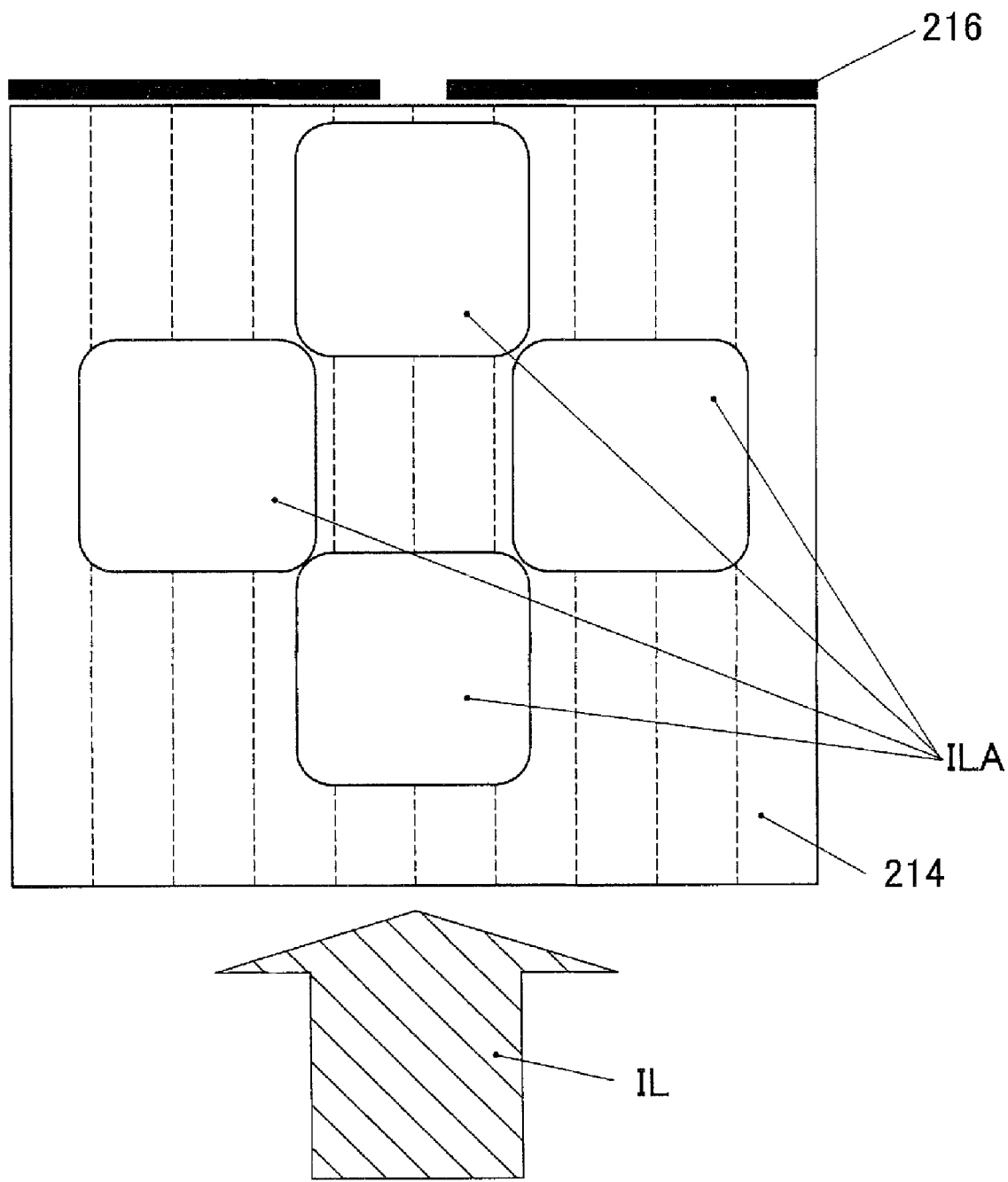
FIG. 26 is a plane view showing that the first integrator shown in FIG. 25 improves the light use efficiency in the quadrupole illumination.

The first reflection integrator 212bb has a plurality of alternate pairs of a flat part and an inclination part as the first reflection integrator 212bb is viewed from each of the X-axis direction and the Z-axis direction, as shown in FIG. 25A, and each device is angled. In addition, as understood from FIGS. 25A and 25B, the first reflection integrator 212bb has a set of four types of devices 212bb1 to 212bb4 that are inclined so that they can heave in the arrow direction. Thereby, as shown in FIG. 26, four areas ILA to be illuminated for the quadrupole illumination can be efficiently illuminated. FIG. 26 is a plane view showing that the light use efficiency improves by using the first reflection integrator 212bb shown in FIGS. 25A-25B for the quadrupole illumination. The interval between the auxiliary mirrors 215 may be adjusted similar to the above examples.

Figure 27A:
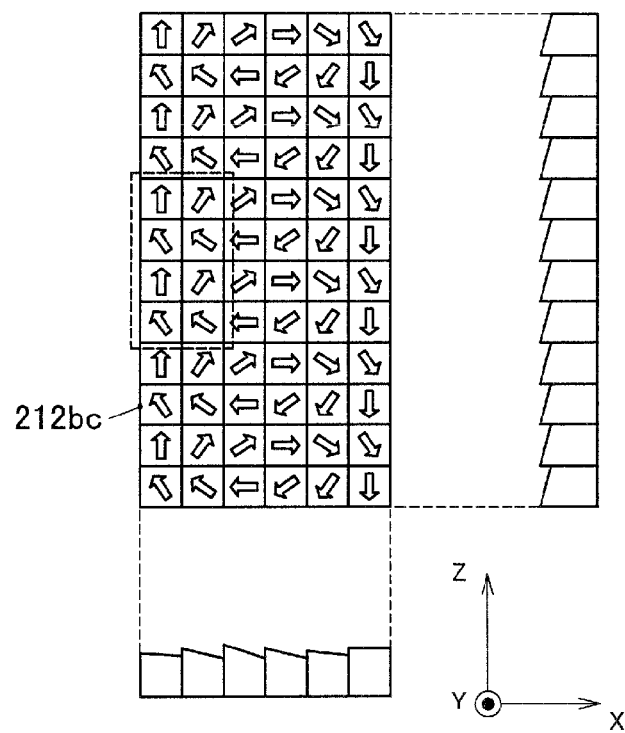
FIGS. 27A-27B are plane, sectional, and partially enlarged perspective views of the first reflection integrator for the annular illumination.
Figure 27B:
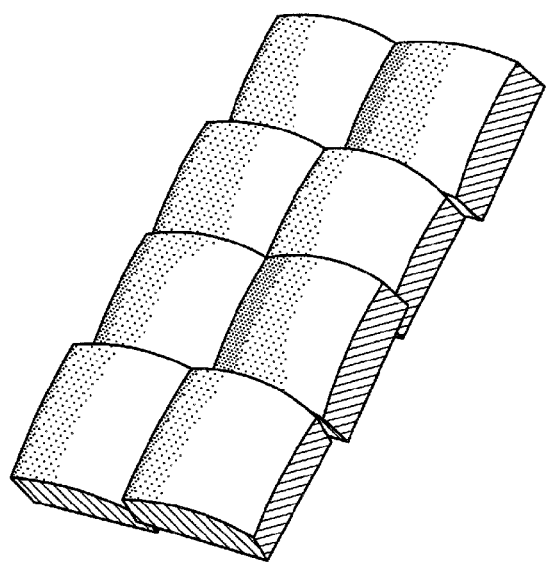

In using the aperture stop 216 having the annular shape shown in FIG. 17E, the first reflection integrator 212 may use the first reflection integrator 212bc shown in FIGS. 27A-27B. The first reflection integrator 212bc provides many different inclination angles (deflection operations) to the plurality of devices.

FIG. 27A is a plane view of the first reflection integrator 212bc viewed from the Y-axis direction perpendicular to its reflection surface, a sectional view of it viewed from the horizontal or X-axis direction at the right side of FIG. 27A, and a sectional view of it viewed from the depth direction or Z-axis direction at the bottom side of FIG. 27A. FIG. 27B is a partially enlarged perspective view of a range enclosed by a dotted line shown in FIG. 27A.

Figure 28:
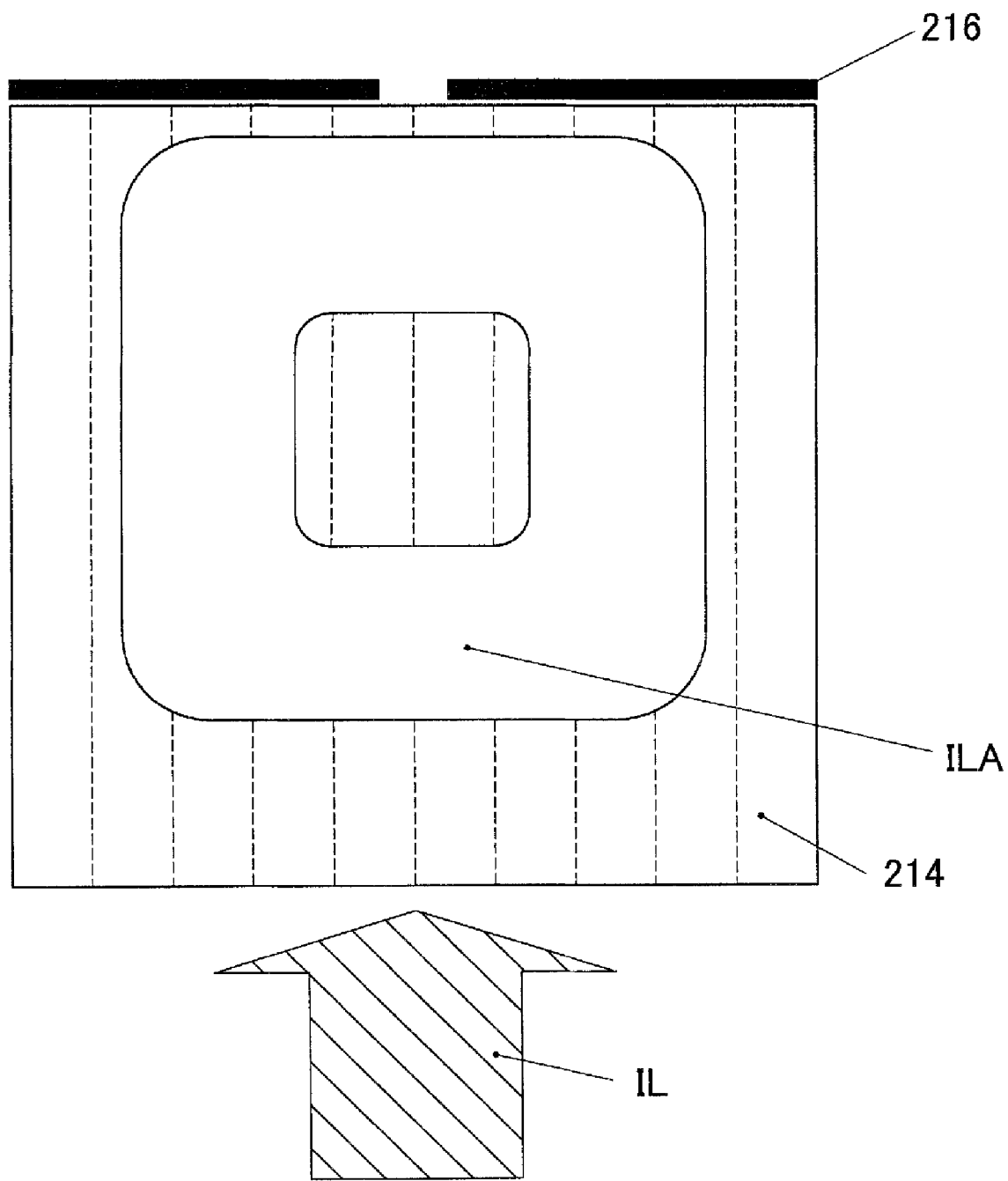
FIG. 28 is a plane view showing that the first integrator shown in FIG. 27 improves the light use efficiency in the annular illumination.

The first reflection integrator 212bc has a plurality of inclination parts having changing inclination angles when the first reflection integrator 212bc is viewed from each of the X-axis direction and the Z-axis direction, as shown in FIG. 27A, and each device is angled. In addition, as understood from FIGS. 27A and 27B, the first reflection integrator 212bc has a plurality of devices that are inclined so that they can heave in the arrow directions. Thereby, as shown in FIG. 28, an annular area ILA to be illuminated for the annular illumination can be efficiently illuminated. FIG. 28 is a plane view showing that the light use efficiency improves by using the first reflection integrator 212bc shown in FIGS. 27A-27B in the annular illumination. The interval between the auxiliary mirrors 215 may be adjusted similar to the above examples.

While this embodiment discusses the example of the shapes of the aperture stop 216 shown in FIGS. 17A-17E, the present invention is not limited to these shapes and is applicable to a variety of shapes.

In exposure, the EUV light generated by the light source unit 100 is introduced to the illumination optical system 210 in the apparatus body 200 via the connector 120 and its shape and light intensity distribution are adjusted. The mask surface that serves as a surface to be illuminated is uniformly illuminated with the illumination area AIA. At this time, this embodiment provides both a selection by the exchange unit (first selector) 212c and an adjustment by the adjustment unit 215c in accordance with a selection of the aperture stop by the aperture stop driving system (second selector) 216c (or in accordance with a shape of the effective light source). The light use efficiency can be improved when the first reflection integrator 212 is selected by the exchange unit (first selector) 212c. In addition, when the adjustment unit 215c adjusts the interval between the auxiliary mirrors 215a and 215b, the good illumination can be provided and the light use efficiency can be improved by restraining the deformation of the effective light source. However, the present invention allows at least one of the selection by the exchange unit 212c and the adjustment by the adjustment unit 215c in accordance with the selection of the aperture stop by the aperture stop driving system 216c. The mask pattern is projected onto the wafer W via the projection optical system 230. Since the distortion of the effective light source is restrained, the exposure with a high resolution can be provided.

The device (such as a semiconductor integrated circuit device or a liquid crystal display device) is manufactured by the step of exposing a photoresist applied substrate (such as a wafer or a glass plate) by using the exposure apparatus according to one of the above embodiments, the step of developing the substrate, and another well-known step.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-225694, filed Sep. 3, 2008, which is hereby incorporated by reference herein in its entirety.

What is claimed is:

1. An illumination optical system configured to illuminate a surface to be illuminated, the illumination optical system comprising:
    a first reflection integrator configured to form a plurality of light sources by using light from a light source;
    a second reflection integrator having a plurality of cylindrical reflection surfaces that possess parallel meridional line directions, the second reflection integrator being configured to form a plurality of linear light sources by using light from the first reflection integrator;
    a pair of flat plane mirrors that are arranged parallel to the meridional line direction on the second reflection integrator and opposite to each other so as to sandwich the plurality of linear light sources in between;

a unit for changing an aperture shape of an aperture stop arranged at an exit side of the second reflection integrator in a direction perpendicular to the meridional line direction so that the aperture stop has an optical Fourier transformation relationship with the surface to be illuminated; and an adjustment unit configured to adjust an interval between the pair of flat plane mirrors as the aperture shape of the aperture stop is changed.

2. The illumination optical system according to claim 1, further comprising a movement unit configured to move the second reflection integrator in the direction perpendicular to the meridional direction as the aperture shape of the aperture stop is changed.

3. The illumination optical system according to claim 1, further comprising an optical unit configured to condense divergent light emitted from the first reflection integrator, between the first reflection integrator and the second reflection integrator along an optical path.

4. The illumination optical system according to claim 1, wherein the aperture stop has a shape configured to provide a modified illumination.

5. An illumination optical system configured to illuminate a surface to be illuminated, the illumination optical system comprising:
- a plurality of first reflection integrators configured to form a plurality of light sources by using light from a light source, the plurality of first reflection integrators having different divergent angles;
- a first selector configured to arrange one of the plurality of first reflection integrators on an optical path;
- a second reflection integrator having a plurality of cylindrical reflection surfaces that possess parallel meridional line directions, the second reflection integrator being configured to form a plurality of linear light sources by using light from the first reflection integrator;
- a pair of flat plane mirrors that are arranged parallel to the meridional line direction on the second reflection integrator and opposite to each other so as to sandwich the plurality of linear light sources in between;
- a plurality of aperture stops arranged at an exit side of the second reflection integrator in a direction perpendicular to the meridional line direction so that each aperture stop can have an optical Fourier transformation relationship with the surface to be illuminated, and the plurality of aperture stops having different aperture patterns;
- a second selector configured to arrange one of the plurality of aperture stops on the optical path; and
- an adjustment unit configured to adjust an interval between the pair of flat plane mirrors,
- wherein at least one of a selection by the first selector and an adjustment by the adjustment unit is performed in accordance with a selection by the second selector.

6. The illumination optical system according to claim 5, wherein at least one of the plurality of first reflection integrators includes a plurality of devices having deflection characteristics different from each other.

7. An exposure apparatus comprising:
- an illumination optical system configured to illuminate an original; and
- a projection optical system configured to project a pattern of the original onto a substrate,
- wherein the illumination optical system includes:
- a first reflection integrator configured to form a plurality of light sources by using light from a light source;
- a second reflection integrator having a plurality of cylindrical reflection surfaces that possess parallel meridional line directions, the second reflection integrator being configured to form a plurality of linear light sources by using light from the first reflection integrator;
- a pair of flat plane mirrors that are arranged parallel to the meridional line direction on the second reflection integrator and opposite to each other so as to sandwich the plurality of linear light sources in between;
- a unit for changing an aperture shape of an aperture stop arranged at an exit side of the second reflection integrator in a direction perpendicular to the meridional line direction so that the aperture stop has an optical Fourier transformation relationship with the surface to be illuminated; and
- an adjustment unit configured to adjust an interval between the pair of flat plane mirrors as the aperture shape of the aperture stop is changed.

8. A device manufacturing method comprising:
- exposing a substrate using an exposure apparatus that includes an illumination optical system configured to illuminate an original, and a projection optical system configured to project a pattern of the original onto the substrate; and
- developing the substrate that has been exposed,
- wherein the illumination optical system includes:
- a first reflection integrator configured to form a plurality of light sources by using light from a light source;
- a second reflection integrator having a plurality of cylindrical reflection surfaces that possess parallel meridional line directions, the second reflection integrator being configured to form a plurality of linear light sources by using light from the first reflection integrator;
- a pair of flat plane mirrors that are arranged parallel to the meridional line direction on the second reflection integrator and opposite to each other so as to sandwich the plurality of linear light sources in between;
- a unit for changing an aperture shape of an aperture stop arranged at an exit side of the second reflection integrator in a direction perpendicular to the meridional line direction so that the aperture stop has an optical Fourier transformation relationship with the surface to be illuminated; and
- an adjustment unit configured to adjust an interval between the pair of flat plane mirrors as the aperture shape of the aperture stop is changed.

* * * * *